United States Patent
McDermott et al.

(10) Patent No.: US 12,159,193 B2
(45) Date of Patent: Dec. 3, 2024

(54) DETERMINISTIC RESET OF SUPERCONDUCTING QUBIT AND CAVITY MODES WITH A MICROWAVE PHOTON COUNTER

(71) Applicant: Wisconsin Alumni Research Foundation, Madison, WI (US)

(72) Inventors: Robert Francis McDermott, Madison, WI (US); Alexander M. Opremcak, Madison, WI (US)

(73) Assignee: WISCONSIN ALUMNI RESEARCH FOUNDATION, Madison, WI (US)

( * ) Notice: Subject to any disclaimer, the term of this patent is extended or adjusted under 35 U.S.C. 154(b) by 909 days.

(21) Appl. No.: 16/952,598

(22) Filed: Nov. 19, 2020

(65) Prior Publication Data

US 2022/0156620 A1    May 19, 2022

(51) Int. Cl.
| | |
|---|---|
| *G06N 5/04* | (2023.01) |
| *G06N 10/00* | (2022.01) |
| *H03K 19/195* | (2006.01) |
| *H10N 60/12* | (2023.01) |
| *H10N 69/00* | (2023.01) |
| *B82Y 10/00* | (2011.01) |

(52) U.S. Cl.
CPC ........... *G06N 10/00* (2019.01); *H03K 19/195* (2013.01); *H10N 60/12* (2023.02); *H10N 69/00* (2023.02); *B82Y 10/00* (2013.01)

(58) Field of Classification Search
CPC .............................. G06N 10/00; H10N 60/12
See application file for complete search history.

(56) References Cited

U.S. PATENT DOCUMENTS

| | | | |
|---|---|---|---|
| 9,692,423 B2 | 6/2017 | McDermott | |
| 2012/0319684 A1* | 12/2012 | Gambetta | G06N 10/00 257/31 |

OTHER PUBLICATIONS

Opremcak et al. "Measurement of a superconducting qubit with a microwave photon counter." Science 361, 1239-1242 (2018). (Year: 2018).*
Abdo, B., et al. "Active Protection of a Superconducting Qubit With an Interferometric Josephson Isolator." Nature communications 10.1 (2019): 3154.
Andersen, C. K., et al. "Entanglement stabilization using ancilla-based parity detection and real-time feedback in superconducting circuits." npj Quantum Information 5.1 (2019): 69.
Andersen, C. K., et al. "Repeated quantum error detection in a surface code." Nature Physics 16.8 (2020): 875-880.
Arute, F., et al. "Quantum supremacy using a programmable superconducting processor." Nature 574.7779 (2019): 505-510.

(Continued)

*Primary Examiner* — Paul A Wartalowicz
(74) *Attorney, Agent, or Firm* — Quarles & Brady, LLP

(57) ABSTRACT

The disclosed technology is directed to systems and methods for deterministic reset of superconducting qubit and cavity modes with a microwave photon counter. The system comprises a multiplicity of qubit-microwave photon counter pairs coupled by a qubit-qubit coupling. Each of the qubit-microwave photon counter pairs comprise a qubit circuit, a microwave photon counter circuit, and a resonant cavity coupling the qubit circuit and the microwave photon counter circuit.

9 Claims, 22 Drawing Sheets
(6 of 22 Drawing Sheet(s) Filed in Color)

(56) References Cited

OTHER PUBLICATIONS

Barends, R., et al. "Coherent Josephson qubit suitable for scalable quantum integrated circuits." Physical review letters 111.8 (2013): 080502.
Blais, A., et al. "Cavity quantum electrodynamics for superconducting electrical circuits: An architecture for quantum computation." Physical Review A 69.6 (2004): 062320.
Bylander, J., et al. "Noise spectroscopy through dynamical decoupling with a superconducting flux qubit." Nature Physics 7.7 (2011): 565-570.
Chapman, B. J., et al. "Widely tunable on-chip microwave circulator for superconducting quantum circuits." Physical Review X 7.4 (2017): 041043.
Chen, Y-F., et al. "Microwave photon counter based on Josephson junctions." Physical review letters 107.21 (2011): 217401.
Chen, Z., et al. "Measuring and suppressing quantum state leakage in a superconducting qubit." Physical review letters 116.2 (2016): 020501.
Cooper, K. B., et al. "Observation of Quantum Oscillations between a Josephson Phase Qubit and a Microscopic Resonator Using Fast Readout." Phys Rev Lett 93.18 (2004): 180401.
Dolan, G. J. "Offset masks for lift-off photoprocessing." Applied Physics Letters 31.5 (1977): 337-339.
Eddins, A., et al. "High-efficiency measurement of an artificial atom embedded in a parametric amplifier." Physical Review X 9.1 (2019): 011004.
Fedorov, K. G., et al. "Fluxon readout of a superconducting qubit." Physical review letters 112.16 (2014): 160502.
Fowler, A. G., et al. "Surface codes: Towards practical large-scale quantum computation." Physical Review A 86.3 (2012): 032324.
Gambetta, J., et al. "Protocols for optimal readout of qubits using a continuous quantum nondemolition measurement." Physical Review A Phys Rev A 76 (2007): 012325.
Govia, LCG, et al. "High-fidelity qubit measurement with a microwave-photon counter." Physical Review A 90.6 (2014): 062307.
Heinsoo, J., et al. "Rapid high-fidelity multiplexed readout of superconducting qubits." Physical Review Applied 10.3 (2018): 034040.
Herr, A., et al. "Design of a ballistic fluxon qubit readout." Superconductor Science and Technology 20.11 (2007): S450.
Hofheinz, M., et al. "Generation of Fock states in a superconducting quantum circuit." Nature 454.7202 (2008): 310-314.
Houck, A. A., et al. "Controlling the spontaneous emission of a superconducting transmon qubit." Physical review letters 101.8 (2008): 080502.
Howington, C., et al. "Interfacing Superconducting Qubits With Cryogenic Logic: Readout." IEEE Transactions on Applied Superconductivity 29.5 (2019).
Hutchings, M. D., et al. "Tunable superconducting qubits with flux-independent coherence." Physical Review Applied 8.4 (2017): 044003.
Jeffrey, E., et al. "Fast accurate state measurement with superconducting qubits." Physical review letters 112.19 (2014): 190504.
Khezri, M. et al. "Hybrid phase-space-Fock-space approach to evolution of a driven nonlinear resonator." Physical Review A 96.4 (2017): 043839.
Khezri, M. et al. "Measuring a transmon qubit in circuit QED: Dressed squeezed states." Physical Review A 94.1 (2016): 012347.
Koch, J., et al. "Charge-insensitive qubit design derived from the Cooper pair box." Physical Review A 76.4 (2007): 042319.
Lecocq, F., et al. "Nonreciprocal microwave signal processing with a field-programmable Josephson amplifier." Physical Review Applied 7.2 (2017): 024028.

Lenander, M., et al. "Measurement of energy decay in superconducting qubits from nonequilibrium quasiparticles." Physical Review B 84.2 (2011): 024501.
Leonard, E., et al. "Digital coherent control of a superconducting qubit." Physical Review Applied 11.1 (2019): 014009.
Lucero, E., et al. "Reduced phase error through optimized control of a superconducting qubit." Physical Review A 82.4 (2010): 042339.
Macklin, C., et al. "A near-quantum-limited Josephson traveling-wave parametric amplifier." Science 350.6258 (2015): 307-310.
Magesan, E., et al. "Efficient measurement of quantum gate error by interleaved randomized benchmarking." Physical review letters 109.8 (2012): 080505.
Martinis, J. M., et al. "Decoherence of a superconducting qubit due to bias noise." Physical Review B 67.9 (2003): 094510.
McDermott, R., et al. "Accurate qubit control with single flux quantum pulses." Physical Review Applied 2.1 (2014): 014007.
McDermott, R., et al. "Quantum-classical interface based on single flux quantum digital logic." Quantum science and technology 3.2 (2018): 024004.
McDermott, R., et al. "Simultaneous state measurement of coupled Josephson phase qubits." Science 307.5713 (2005): 1299-1302.
Motzoi, F., et al. "Simple pulses for elimination of leakage in weakly nonlinear qubits." Physical review letters 103.11 (2009): 110501.
Mutus, J. Y., et al. "Strong environmental coupling in a Josephson parametric amplifier." Applied Physics Letters 104.26 (2014): 263513.
Opremcak et al., "High-Fidelity Measurement of a Superconducting Qubit using an On-Chip Microwave Photon Counter." arXiv:2008.02346 (Aug. 5, 2020).
Opremcak, A., et al. "Measurement of a superconducting qubit with a microwave photon counter." Science 361.6408 (2018): 1239-1242.
Patel, U., et al. "Phonon-mediated quasiparticle poisoning of superconducting microwave resonators." Physical Review B 96.22 (2017): 220501.
Riwar, R-P., et al. "Efficient quasiparticle traps with low dissipation through gap engineering." Physical Review B 100.14 (2019): 144514.
Schuster, D. I., et al. "ac Stark shift and dephasing of a superconducting qubit strongly coupled to a cavity field." Physical Review Letters 94.12 (2005): 123602.
Schuster, D. I., et al. "Resolving photon number states in a superconducting circuit." Nature 445.7127 (2007): 515-518.
Sears, A. P., et al. "Photon shot noise dephasing in the strong-dispersive limit of circuit QED." Physical Review B Phys Rev B 86.180504 (2012): 180504.
Sliwa, K. M., et al. "Reconfigurable Josephson circulator/directional amplifier." Physical Review X 5.4 (2015): 041020.
Thorbeck, T., et al. "Reverse isolation and backaction of the SLUG microwave amplifier." Physical Review Applied 8.5 (2017): 054007.
Wallraff, A., et al. "Approaching unit visibility for control of a superconducting qubit with dispersive readout." Physical review letters 95.6 (2005): 060501.
Walter, T., et al. "Rapid high-fidelity single-shot dispersive readout of superconducting qubits." Physical Review Applied 7.5 (2017): 054020.
Wenner, J., et al. "Excitation of superconducting qubits from hot nonequilibrium quasiparticles." Physical review letters 110.15 (2013): 150502.
Yan, F., et al. "Distinguishing coherent and thermal photon noise in a circuit quantum electrodynamical system." Physical review letters 120.26 (2018): 260504.
Yan, F., et al. "The flux qubit revisited to enhance coherence and reproducibility." Nature Communications 7 (2016): 12964-12964.

\* cited by examiner

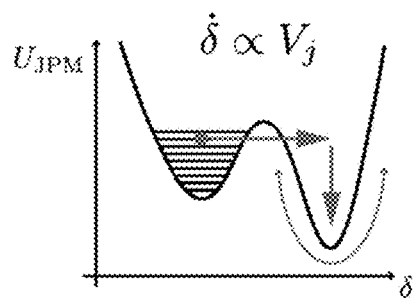
FIG. 7A
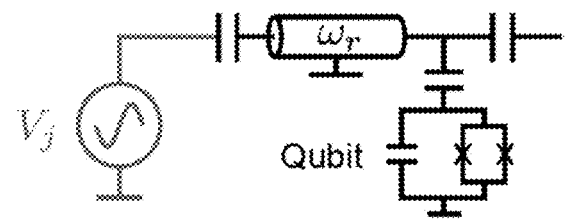
FIG. 7B
FIG. 7C
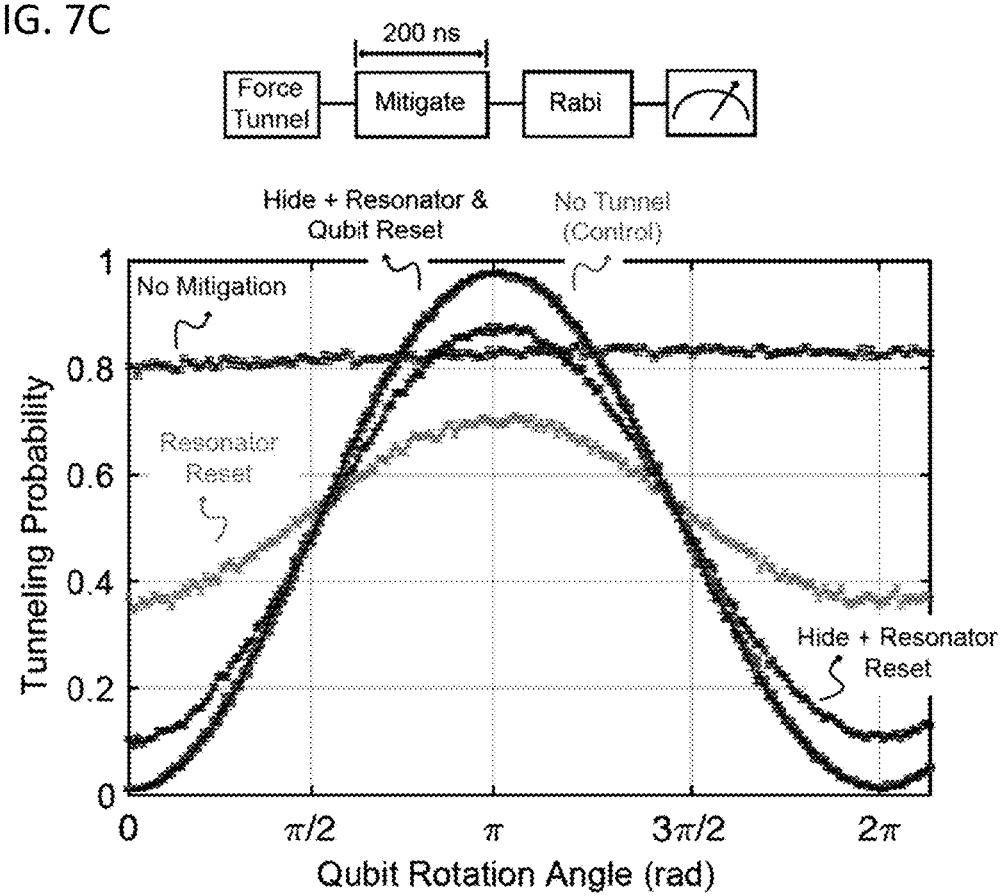

DETERMINISTIC RESET OF SUPERCONDUCTING QUBIT AND CAVITY MODES WITH A MICROWAVE PHOTON COUNTER

STATEMENT REGARDING FEDERALLY SPONSORED RESEARCH

This invention was made with government support under 1720304 awarded by National Science Foundation. The government has certain rights in the invention.

FIELD OF THE INVENTION

The disclosed technology is generally directed to quantum information processing and systems. More particularly the technology is directed to systems and methods for deterministic reset of superconducting qubit and cavity modes with a microwave photon counter.

BACKGROUND OF THE INVENTION

Fast, accurate state measurement is critical to the implementation of quantum error correction, and global optimization of a large-scale quantum processor demands minimization of physical resources required for qubit measurement. Prior work on the measurement of superconducting qubits has focused on suppression of errors through combined improvements in measurement speed and near-quantum-limited preamplification of the measurement signal; however, the physical footprint of the superconducting amplifiers, nonreciprocal circuit elements, and heterodyne detectors required to implement high-fidelity amplifier-based qubit measurement represents a significant obstacle to scaling. There have been efforts to minimize the hardware overhead associated with qubit measurement using Josephson circulators and directional amplifiers, but the instantaneous bandwidths of these elements are at present too small to support multiplexed qubit measurement, the primary advantage of amplifier-based approaches. In related work, state-of-the-art measurement efficiencies were achieved by directly embedding a qubit within a Josephson parametric amplifier; however, this approach is not amenable to integration with large-scale multiqubit arrays. While continued research in these directions is certainly essential, it is clear that there are major obstacles to be overcome.

BRIEF SUMMARY OF THE INVENTION

The disclosed technology is directed to systems and methods for deterministic reset of superconducting qubit and cavity modes with a microwave photon counter. One aspect of the invention is a system for information processing. The system comprises a multiplicity of qubit-microwave photon counter pairs coupled by a qubit-qubit coupling. Each of the qubit-microwave photon counter pairs comprise a qubit circuit, a microwave photon counter circuit, and a resonant cavity coupling the qubit circuit and the microwave photon counter circuit. Coupling of the qubit circuit and resonant cavity is configured to yield distinct frequencies corresponding to a bright cavity pointer state and a dark cavity pointer state characterized by differential photon occupation and the system is configured to displace a photon field inside the resonant cavity in a qubit state-dependent manner when a microwave drive frequency is applied. The microwave photon counter circuit is a threshold detector of microwave photon occupation of the resonator cavity. In some embodiments, the microwave photon counter circuit is configured to yield a double-well potential energy landscape. In some embodiments, the system utilizes a Josephson photomultiplier (JPM) circuit, a frequency-tunable transmon qubit, a half-wave coplanar waveguide (CPW), or any combination thereof.

In some embodiments, the system further comprises a controller configured to frequency tune the microwave photon counter circuit into or out of resonance with the qubit circuit or the resonant cavity and/or a controller configured to provide the microwave drive frequency to the qubit or prepare the cavity point states. In some embodiments, the controller is configured to frequency tune the microwave photon counter circuit and qubit circuit into simultaneous resonance with the resonant cavity.

Another aspect of the invention provides for microwave photon counter-assisted resonator reset or microwave photon counter-assisted qubit reset. The method comprises frequency tuning a qubit-microwave photon counter pair. Suitably, a microwave photon counter circuit may be tuned into resonance with a qubit circuit or a resonant cavity. In some embodiments, the microwave photon counter circuit and qubit circuit is frequency tuned into simultaneous resonance with the resonant cavity.

Another aspect for the invention provides for a method for quantum information processing or for a quantum computation. The method comprises preparing a qubit cavity pointer state by applying a microwave drive frequency, frequency tuning a microwave photon counter circuit thereby inducing an intrawell excitation of a phase particle conditioned on the qubit cavity pointer state, frequency tuning the microwave photon counter circuit at a tunneling flux for a tunneling time thereby allowing interwell tunneling of the phase particle, frequency tuning the microwave photon counter at a relaxation flux for a relaxation time thereby allowing for relaxation of a tunneled phase particle, determining the flux state of the microwave photon counter circuit, and resetting the resonant cavity or the qubit circuit. In some embodiments, resetting the resonant cavity or qubit circuit comprises frequency tuning the microwave photon counter circuit and qubit circuit into simultaneous resonance with the resonant cavity. In some embodiments, the method further comprises frequency tuning the microwave photon counter circuit to minimize microwave photon counter-induced damping of the resonant cavity.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention.

FIG. 1A shows dispersive coupling of the qubit and the resonator yield distinct dressed frequencies corresponding to the qubit states |0> and |1>. FIG. 1B shows photodetection of the resonator using a microwave photon counter following pointer state preparation; here, the counter acts as a threshold discriminator of microwave photon occupation $\bar{n}_r$. FIG. 1C shows that resonant interaction of the microwave photon counter with the cavity leads to conditional excitation of the microwave photon counter followed by a tunneling transition between classically distinguishable flux states of the device.

FIG. 2A shows an optical micrograph of the circuit with overlaid text to indicate port functionality and the locations of critical circuit components. FIG. 2B shows a schematic diagram of the circuit. FIG. 2C shows a false-color micrograph of a JPM element. FIG. 2D is a schematic of a quantum computing system. FIG. 2E shows the wiring diagram and vertical dashed lines divide temperature stages used in the experimental setup. FIG. 2F defines circuit components used in the wiring diagram of FIG. 2E. All components within the μ-metal shield are made of non-magnetic materials.

FIG. 3A shows microwave photon counter spectroscopy versus external flux. The spectroscopy signal is acquired from a reflection measurement at readout port $j_r$. FIG. 3B shows contrast in IQ signal for reflection from the microwave photon counter prepared in the left and right wells of the double-well potential.

FIG. 4A shows measurement timing diagram. FIG. 4B shows time evolution of high-contrast microwave cavity pointer states as detected by the microwave photon counter for qubits initialized in states |0> (lower trace) and |1> (upper trace). The optimal time for pointer state drive is indicated by the arrow. FIG. 4C shows microwave photon counter tunneling probability versus photodetection time for qubits prepared in states |0> (lower trace) and |1> (upper trace). The optimal time for microwave photon counter-cavity interaction is indicated by the arrow. FIG. 4D shows microwave photon counter tunneling probability versus tunnel bias amplitude for qubits prepared in states |0> (lower trace) and |1> (upper trace).

FIG. 5A shows microwave photon counter tunneling probability versus resonator drive time and frequency with the qubit prepared in |0>. FIG. 5B shows JPM tunneling probability as in FIG. 5A, but with the qubit prepared in |1>. FIG. 5C shows that the difference in these scans allows determination of the optimal drive frequency and time that maximize single-shot measurement fidelity. Two local maxima in measurement fidelity for drive frequencies near $\omega_{r,|0>}$ (overlaid circles) and $\omega_{r,|1>}$ (overlaid squares) for a duration $t_d = \pi/\chi$ are determined. These datasets were taken at a resonator drive amplitude of 0.8 arb. units. FIG. 5D shows JPM tunneling probability versus resonator drive amplitude and time with the qubit prepared in the |0> state. This scan uses the drive frequency $\omega_d \approx \omega_{r,|1>}$. FIG. 5E shows JPM tunneling probability as in FIG. 5D, but with the qubit prepared in |1>. FIG. 5F shows the difference in these scans yields the optimal drive amplitude and time for pointer state preparation as indicated by the overlaid X symbols.

FIG. 6A shows microwave photon counter tunneling probability versus qubit rotation angle to identify values for P(1|0) (0 rotation) and P(1|1) (π rotation). For this dataset, P(1|0)=0.4% and P(1|0)=99.0%. FIG. 6B shows a histogram of measurement fidelity F logged over the span of twelve hours (20,000 independent measurements of F), demonstrating the robustness of microwave photon counter-based measurement with respect to long-term drift. A Gaussian fit to the histogram yields an average fidelity F̄=98.4% with standard deviation $\sigma_F$=0.2%.

FIGS. 7A-7C show a characterization and mitigation of backaction induced by the microwave photon counter tunneling event. FIG. 7A shows that relaxation processes following a microwave photon counter tunneling event deposit an energy of order 100 photons on chip. FIG. 7B shows by the ac Josephson relation, the JPM is modeled as an effective voltage source $V_j$ that can excite both the resonator and qubit modes. FIG. 7C shows Rabi experiments preceded by a forced microwave photon counter tunneling event followed by various mitigation steps. The hide step is accomplished by biasing the qubit to a frequency where backaction from the forced tunneling event is minimal. With full mitigation (i.e. qubit hide bias plus resonator and qubit reset), we recover all but 0.2% of the measurement fidelity compared to the experiment with no forced microwave photon counter tunneling event.

FIG. 8A shows a spin echo dataset taken on the q1-j1 system on chip #1 with and without a prior forced tunneling event on the q2-j2 system. FIG. 8B shows spin echo data as in FIG. 8A, but with resonator reset on system q2-j2 following the forced tunneling event. Identical spin-echo fringes with respect to the control are recovered. FIG. 8C shows interleaved randomized benchmarking (IRB) experiment to quantify the performance of our crosstalk mitigation strategy. Identical IRB gate fidelities are measured for the tunnel and no tunnel cases following resonator reset on q2-j2 (see Table 3 for further detail).

FIG. 9A shows timing sequence of the experiment to probe sensitivity to measurement repetition rate. Each measurement takes 700 ns from start to finish, including resonator and qubit reset. FIG. 9B shows microwave photon counter-detection of the qubit |0> and |1> states versus interval between measurements. FIG. 9C shows microwave photon counter-detection as in FIG. 9B, but with the qubit |0> state mapped to the bright pointer (i.e. $\omega_d = \omega_{r,|0>}$). FIGS. 9B-9C indicate degradation in both JPM detection efficiency and qubit $T_1$ as the repetition rate is increased, with the former playing the dominant role.

FIG. 10A shows the pulse sequence used for pointer-state calibration. These experiments were performed at the optimal resonator drive amplitude 0.885 arb. units. FIG. 10B shows qubit frequency shift versus Stark drive time for the bright pointer state. FIG. 10C shows qubit frequency shift as in FIG. 10B, but for the dark pointer state.

FIG. 11A shows microwave photon counter tunneling probability versus resonator drive amplitude for qubits initialized in states |0> and |1>. Based on the Stark calibration at the optimal drive amplitude 0.885 arb. units, the maximum photon occupation of the dark pointer is less than one photon ($<<n_{crit}$) for drive amplitudes 0.4 arb. units. Therefore, the dressed resonance corresponding to the qubit |0> state is well approximated by a linear mode during driven evolution. FIG. 11B shows linear fits of microwave photon counter tunneling probability versus resonator drive amplitude over the range from 0.25-0.4 arb. units with the qubit prepared in |1>. FIG. 11C shows linear fits of microwave photon counter tunneling probability as in FIG. 11B, but with the qubit prepared in |0>.

FIG. 12A shows microwave photon counter photodetection of the bright pointer state after a variable ring-down delay. Passive resonator reset requires around 10 µs, which is too slow for the surface code cycle. FIG. 12B shows microwave photon counter photodetection as in FIG. 12A, but with the microwave photon counter biased into resonance with the resonator $\omega_r=\omega_j$ during the ring-down delay. Active resonator reset is performed in under 100 ns. FIG. 12C shows a qubit $T_1$ experiment. Passive qubit reset based on intrinsic relaxation processes requires a time of order 20 µs. FIG. 12D shows a qubit $T_1$ experiment as in FIG. 12C, but with the microwave photon counter and qubit biased into resonance with the measurement resonator ($\omega_r=\omega_j=\omega_q$) during the $T_1$-delay. Active qubit reset is performed in under 100 ns.

DETAILED DESCRIPTION OF THE INVENTION

Herein disclosed is an approach to the high-fidelity measurement of a superconducting qubit using an on-chip microwave photon counter. The protocol relies on the transient response of a dispersively coupled measurement resonator to map the state of the qubit to "bright" and "dark" cavity pointer states that are characterized by a large differential photon occupation. Following this mapping, the resonator is photodetected using a detector, which transitions between classically distinguishable flux states when cavity photon occupation exceeds a certain threshold. The present approach provides access to the binary outcome of projective quantum measurement at the millikelvin stage without the need for quantum-limited preamplification and thresholding at room temperature. As demonstrated in the Examples, raw single-shot measurement fidelity in excess of 98% across multiple samples was achieved using this approach in total measurement times under 500 ns. In addition, the Examples show that the backaction and crosstalk associated with the disclosed measurement protocol can be mitigated by exploiting the intrinsic damping of the detector itself.

Figure 1A:
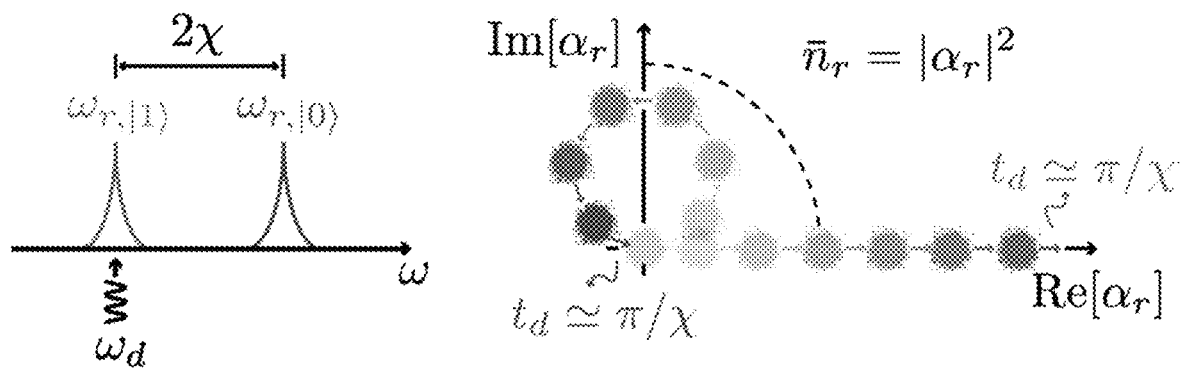
FIGS. 1A-1C show qubit measurement with a photon counter.

The measurement protocol relies on the transient response of a dispersively coupled linear resonator to map the state of the qubit onto "bright" and "dark" cavity pointer states characterized by a large differential photon occupation. Referring to FIG. 1A, dispersive coupling of the qubit and the readout resonator yields distinct dressed frequencies of the cavity $\omega_{r,|0>}$ and $\omega_{r,|1>}$ corresponding to qubit states |0> and |1>, respectively. Resonance is an enhanced coupling between states of a system with the same or approximately the same energy. Resonance between the states may induce or trigger an event or change in the system. The application of a microwave drive at frequency $\omega_d \simeq \omega_{r,|1>}$ displaces the photon field inside the resonator in a qubit state-dependent manner. For resonant drive, the field displaces along a single quadrature axis which is shown as Re[$\alpha_r$], where |$\alpha_r$> is the coherent state of the resonator. For off-resonant drive, the readout cavity acquires a transient occupation; however, the cavity state coherently oscillates back toward vacuum at a time $\pi/\chi$, where $2\chi=\omega_{r,|0>}-\omega_{r,|1>}$. Therefore, drive for duration $t_d=\pi/\chi$ maps the qubit state to "bright" and "dark" cavity pointer states with large differential photon occupation. Preparation and use of cavity pointer states for quantum information processing or quantum computation are generally described in U.S. Pat. No. 9,692,423, which is incorporated by reference in its entirety.

Figure 1B:
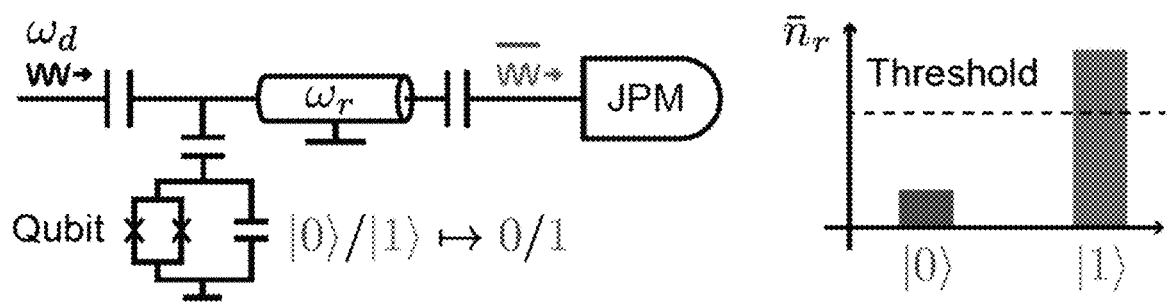

Following this mapping, the resonator is photodetected with a microwave photon counter, such as a Josephson Photomultiplier (JPM). Referring to FIG. 1B, the microwave photon counter may be based on a capacitively shunted rf Superconducting QUantum Interference Device (SQUID) with circuit parameters chosen to yield a double-well potential energy landscape. Following pointer state preparation, the resonator coupling the qubit and the microwave photon counter is photodetected using the microwave photon counter, which acts as a threshold discriminator of microwave photon occupation $\bar{n}_r$. Moreover, the microwave photon counter may be used for deterministic reset of the qubit or cavity modes that, in turn, mitigates backaction and crosstalk between coupled qubits.

Figure 1C:
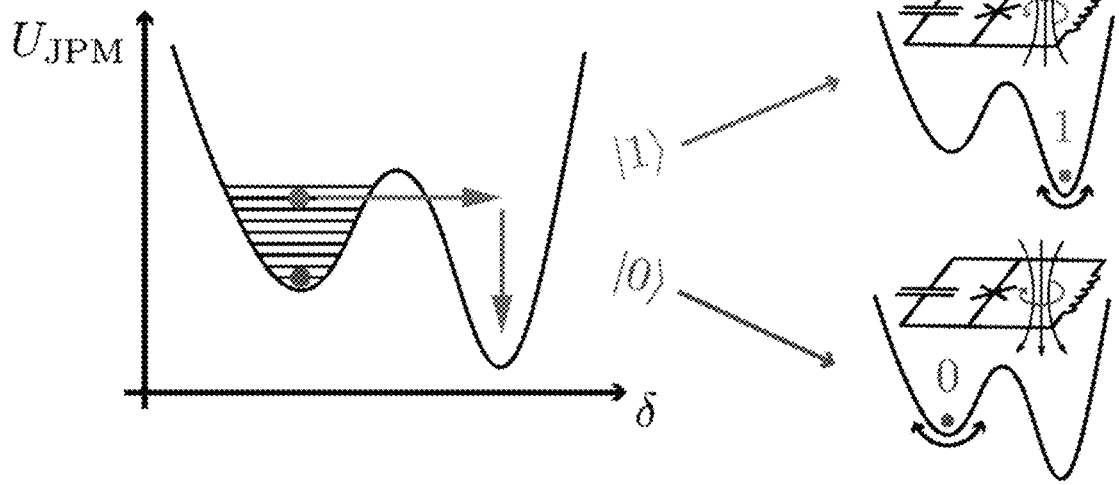

Referring to FIG. 1C, photodetection involves resonant transfer of energy from the bright cavity pointer state of the readout cavity to the detector, followed by an interwell tunneling transition that changes the flux state of the detector. When the readout cavity is prepared in the dark state, no tunneling transition occurs. By analogy, the flux state of the detector operates as a classical bit and the outcome of projective quantum measurement can be accessed at the millikelvin stage without the need for heterodyne detection and thresholding at room temperature. Without any fine tuning of qubit or detector parameters, single shot measurement fidelities (uncorrected for qubit relaxation and initialization errors) in excess of 98% for total measurement times around 500 ns are achieved in the provided Examples.

While the Examples illustrate chips comprising two coupled qubits, each with its own dedicated detector, the approach can be scaled to arbitrary system size, as the physical footprint of the detector is well matched to the footprint of the qubit. The disclosed approach requires at most one additional flux bias line per qubit channel, while greatly relaxing the physical resources needed downstream of the millikelvin stage. Accordingly, systems or chips of the present technology may comprise a multiplicity of qubits, including, without limitation, 2, 3, 4, 5, 6, 7, 8, 9, 10, 20, 30, 40, 50, 60, 70, 80, 90, 100, 200, 300, 400, 500, 600, 700, 800, 900, 1000 or more qubits.

Systems for Quantum Information Processing

One aspect of the invention provides for circuits for quantum information processing. The presently disclosed circuits comprise a multiplicity of coupled qubit-microwave photon counter pairs. Each of the qubit-microwave photon counter pairs comprise a qubit circuit and a microwave photon counter circuit coupled to a resonant cavity. The qubit circuit, microwave photon counter circuit, and resonant cavity, may be referred to as qubit, microwave photon counter, or resonator, respectively, depending on context. The qubits of the qubit-microwave photon counter pair may be coupled to one or more other qubits of the system. Suitably, the qubit may be coupled to a multiplicity of qubits, including, without limitation, 1, 2, 3, 4, 5, 6, 7, 8, 9, 10, 20, 30, 40, 50, 60, 70, 80, 90, 100, 200, 300, 400, 500, 600, 700, 800, 900, 1000 or more qubits.

Qubit refers to a multi-level quantum-mechanical system capable of use in quantum information processing. In contrast to classical computational methods that rely on binary data stored in the form of definite on/off states, or classical bits, qubits take advantage of the quantum mechanical nature of quantum systems to store and manipulate data. Specifically, quantum systems can be described by multiple quantized energy levels or states and can be represented probabilistically using a superposition of those states.

The qubits used with the present technology may be superconducting qubits. Superconducting qubit refers a qubit comprising superconducting circuit elements. Suitably, information is stored in the quantum degrees of freedom of an anharmonic oscillator. An advantageous feature of superconducting qubits is that their energy-level spectra are governed by circuit element parameters and thus are configurable. The superconducting qubit may be a flux qubit, such as an rf SQUID qubit, a charge qubit, or a phase qubit. In particular embodiments, the qubit is a transmon qubit such as the dispersively coupled transmon qubit used in the Examples.

The qubit is entangled with a resonator configured for the preparation of cavity pointer states. The cavity pointer states are characterized by a large differential photon occupation followed by subsequent photodetection. A microwave driven at one of the two dressed cavity frequencies maps the qubit onto a "bright" cavity pointer state or a "dark" cavity pointer state. The discrimination of the pointer states is performed by a microwave photon counter, such as a JPM. The microwave photon counter may frequency tuned close to a critical flux where a phase slip occurs. The microwave photon counter may be frequency tuned by applying a flux bias, as in the Examples, but other methods of frequency tuning may also be used. Suitably, the microwave photon counter may be frequency tuned by applying a current, voltage, or the like to the microwave photon counter suitably for modulating the frequency of the microwave photon counter. In some embodiments, the resonator is a half-wave coplanar waveguide (CPW) but other resonators may be used so long as they can be coupled to both the qubit and the photon counter. The circuit parameters are chosen to yield a potential energy landscape with one or two local minima, depending on how the circuit is frequency tuned, such as by applying a flux bias; the distinct local minima correspond to classically distinguishable flux states in the device. Once the microwave photon counter is properly frequency tuned, the presence of resonant microwaves induces a rapid tunneling event between the two classically distinguishable states of the detector. In the absence of microwave input, transitions occur at an exponentially suppressed dark rate. Thus, the absorption of resonant microwaves creates a readily measured signal.

Figure 2A:
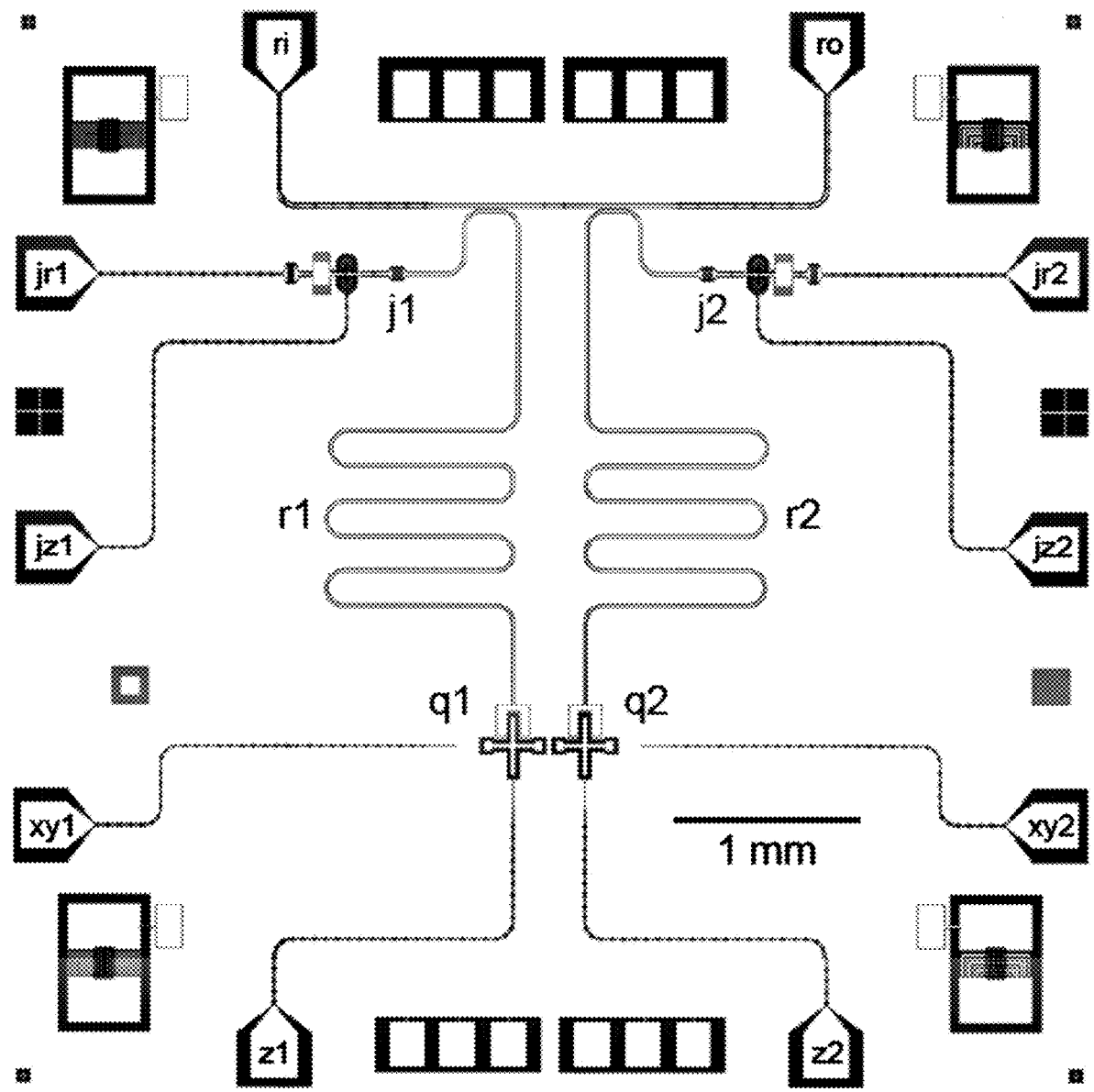
FIGS. 2A-2F illustrate the device layout and wiring diagram.
Figure 2B:
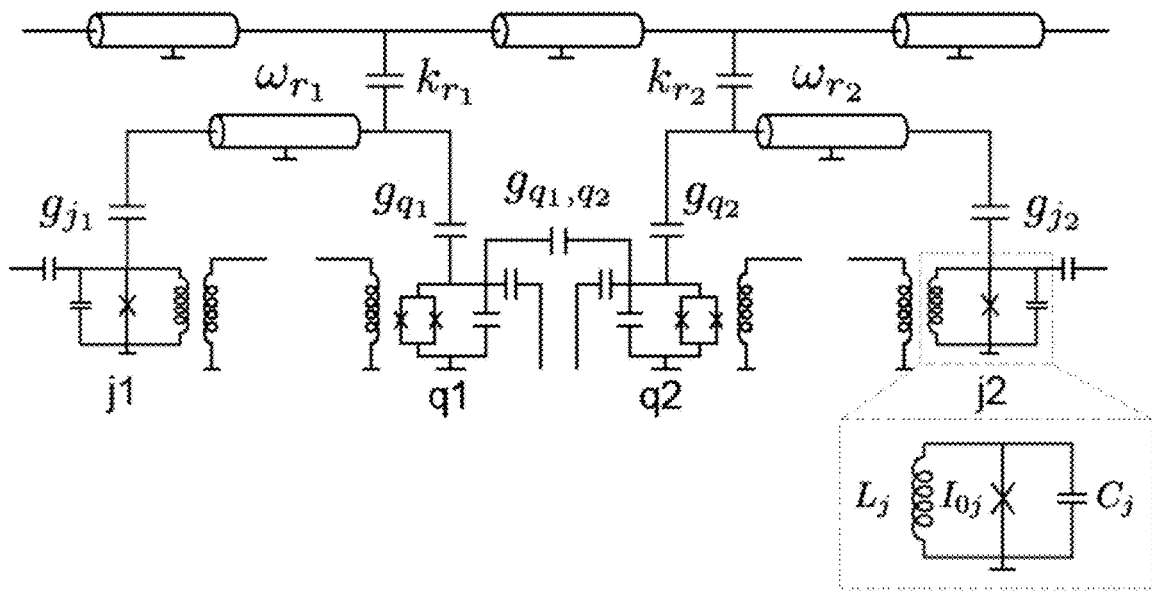

FIGS. 2A and 2B illustrate an exemplary circuit that comprises two coupled qubit-microwave photon counter pairs integrated onto a single silicon chip. FIG. 2A shows a micrograph of such a circuit. The circuit schematic is shown in FIG. 2B, which introduces notation that will be used throughout. Each qubit-microwave photon counter pair incorporates a qubit q, an excitation line xy, a flux bias line z, a microwave photon counter j, a readout line jr, a flux bias line jz, and each qubit-microwave photon counter pair is coupled to a resonator r. The readout line comprises input $r_i$ and output $r_o$ ports that may be used to monitor the readout cavity of the microwave photon counter or create cavity pointer states. As used in FIGS. 2A-2B, the ordinal number associated with each of the components signifies the first or second qubit-microwave photon counter pair, respectively.

The exemplary qubit-microwave photon counter pair may incorporate a frequency-tunable transmon that is dispersively coupled to a half-wave coplanar waveguide (CPW) measurement resonator with bare frequency $\omega_r/2\pi$ and qubit-resonator coupling strength $g_{q,r}/2\pi$. The total energy decay rate of the measurement resonator Kr may be approximately two orders of magnitude smaller than that for a typical Purcell-filtered design. The transmon has a maximum transition frequency $\omega_q/2\pi$ and an anharmonicity $\eta/2\pi$. There is a distinct advantage of the present approach to qubit measurement compared to amplifier-based implementations: by reading out the measurement resonator with the microwave photon counter, the usual tradeoff between measurement speed and Purcell limit to $T_1$ may be avoided, as coupling of the measurement resonator to its readout environment can be tuned over a broad range on nanosecond timescales by appropriate variation of the microwave photon counter bias point. In principle, the value of $\kappa_r$ can be made arbitrarily small without affecting the measurement speed. As a practical matter, however, a balance must be struck to ensure that the power delivered to the measurement resonator is sufficient for creation of the bright pointer state.

Figure 2C:
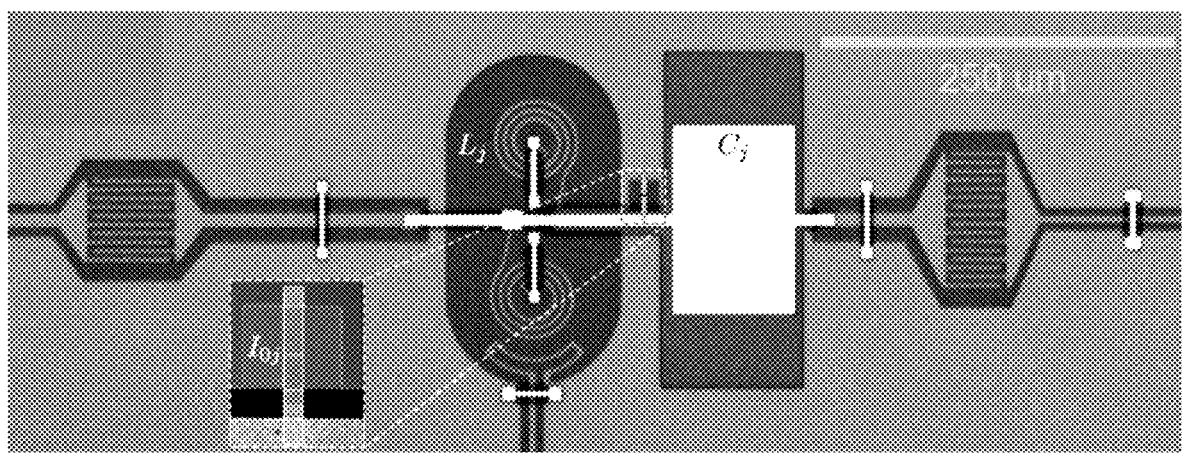

At the opposite voltage antinode, the measurement resonator is capacitively coupled to the microwave photon counter with coupling strength $g_{j,r}/2\pi$. The half-swap period $\pi/2g_{j,r}$ is compatible with GS/s waveform generation and comparable to the energy relaxation time of the microwave photon counter $T_{1,j}$. The microwave photon counter may comprise a JPM circuit formed by the parallel combination of a 3+3-turn gradiometric loop with inductance $L_j$, a parallel-plate capacitance $C_j$, and a single Josephson junction with critical current $I_{oj}$ [see FIG. 2B-2C]. The plasma frequency of the JPM is tunable with external flux, allowing for both resonant and far-detuned interactions with the measurement resonator. To retrieve qubit measurement results from the JPM, the circuit is read out in reflection using the capacitively coupled readout port labeled jr in FIG. 2A. The two metastable flux states of the JPM correspond to distinct plasma frequencies; therefore, microwave reflectometry in the vicinity of these resonances encodes the JPM flux onto the amplitude and phase of the reflected signal.

Parameters for an exemplary qubit-JPM pair q1-j1 on chip #1 used in the Examples are summarized in Table 1.

TABLE 1

Circuit parameters for chip #1.

| Label | Description | Value | Method of Determination |
|---|---|---|---|
| $g_{j1}/2\pi$ | JPM-resonator coupling strength for j1-r1 | 62 MHz | JPM spectroscopy versus flux |
| $g_{j2}/2\pi$ | JPM-resonator coupling strength for j2-r2 | 63 MHz | JPM spectroscopy versus flux |
| $g_{r1}/2\pi$ | Qubit-resonator coupling strength for q1-r1 | 90 MHz | Qubit and resonator spectroscopy |
| $g_{r2}/2\pi$ | Qubit-resonator coupling strength for q2-r2 | 92 MHz | Qubit and resonator spectroscopy |
| $\omega_{r1}/2\pi$ | Bare frequency for resonator r1 | 5.693 GHz | High power resonator spectroscopy with j1 maximally detuned |
| $\omega_{r2}/2\pi$ | Bare frequency for resonator r2 | 5.825 GHz | High power resonator spectroscopy with j2 maximally detuned |

TABLE 1-continued

Circuit parameters for chip #1.

| Label | Description | Value | Method of Determination |
|---|---|---|---|
| $\kappa_{r_1}$ | Total energy decay rate of resonator r1 | 1/(1.53 μs) | VNA measurements with j1 maximally detuned |
| $\kappa_{r_2}$ | Total energy decay rate of resonator r2 | 1/(1.51 μs) | VNA measurements with j2 maximally detuned |
| $g_{q1,q2}/2\pi$ | Qubit-resonator coupling strength | 16 MHz | Qubit spectroscopy about the avoided level crossing (degeneracy at 5.1 GHz) |
| $T_{1j}$ | Engergy relaxation time of the JPM | 5 ns | VNA measurements with the JPM detuned from the resonator |
| $L_j$ | Geometric inductance of the JPM | 1.3 nH | JPM spectroscopy versus flux |
| $C_j$ | Self-capacitance of the JPM | 2.2 pF | JPM spectroscopy versus flux |
| $C_{jr}$ | Reflection capacitor of the JPM | 33 fF | JPM spectroscopy versus flux |
| $I_{oj}$ | Critical current of the JPM | 1.4 μA | JPM spectroscopy versus flux and 4-wire resistance measurements of cofabricated test junctions |
| $M_j$ | Mututal inductance between the JPM and external bias circuitry | 4.8 pH | JPM spectroscopy versus flux |
| $I_{0q}$ | Total critical current of the transurion dc SQUID loop | 4. nA | Qubit spectroscopy versus flux |
| $M_q$ | Mutual inductance between the qubit and external bias circuitry | 1.4 pH | Resonator spectroscopy versus qubit flux |
| $\eta/2\pi$ | Qubit anharmonicity | −225 MHz | Qubit spectroscopy of the $|0\rangle \rightarrow |1\rangle$ and $|1\rangle \rightarrow |2\rangle$ transitions |
| $C_{xy}$ | Qubit excitation capacitance | 40 aF | Sonnet simulation |

Figure 2D:
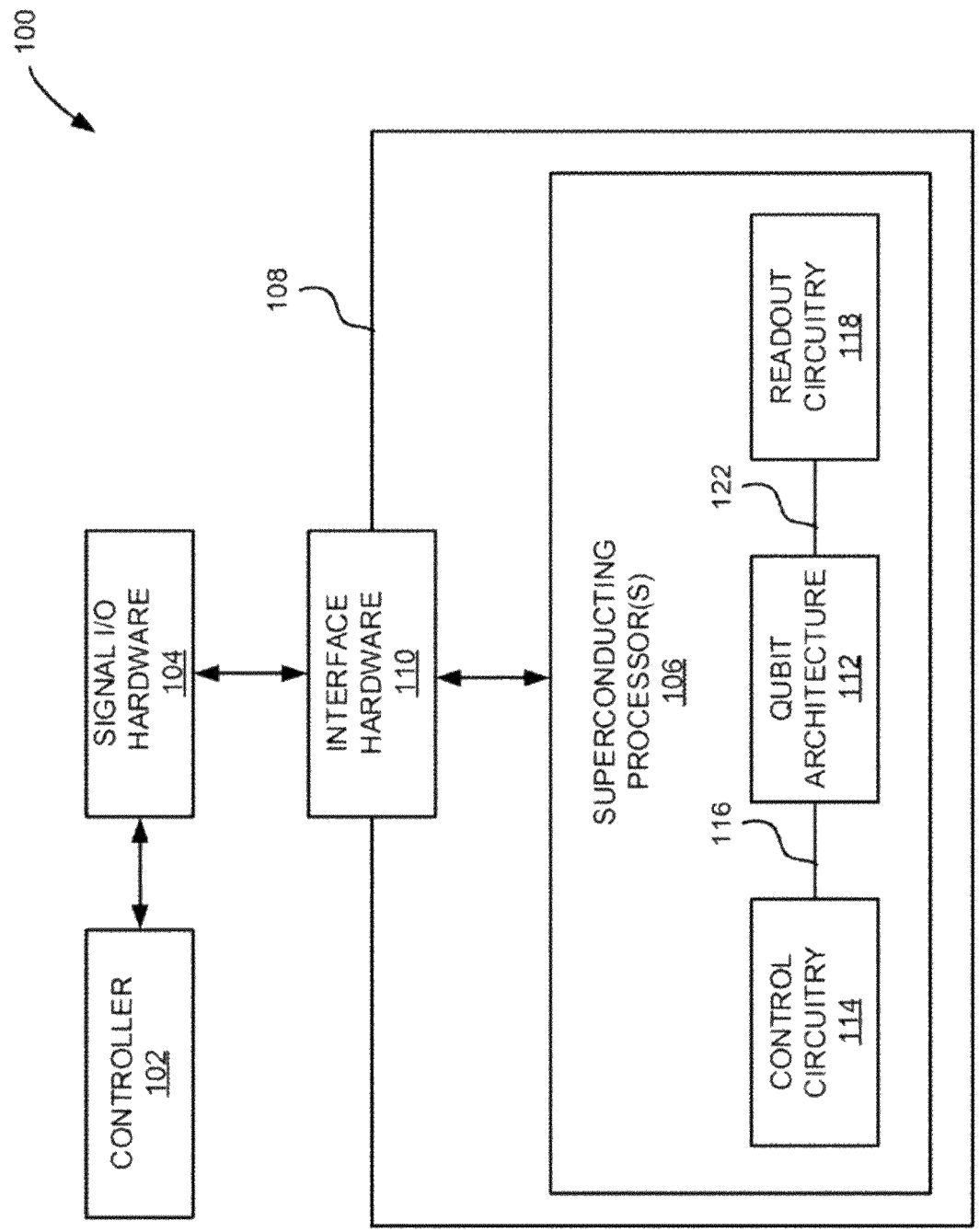

Turning now to FIG. 2D, an example system 100 for use in quantum information processing or quantum computation, in accordance with the present disclosure, is shown. In some embodiments, the system 100 may include a controller 102 and signal input/output (I/O) hardware 104 in communication with the controller 102. The system 100 may also include one or more superconducting processors 106 contained in a housing unit 108, where the superconducting processor(s) 106 is configured to perform a variety of quantum computations or quantum information processing. In addition, the system 100 may also include various interface hardware 110 for communicating and controlling signals between the signal I/O hardware 104 and the superconducting processor(s) 106.

The signal I/O hardware 104 may include various electronic systems, hardware and circuitry capable of a wide range of functionality. For example, the signal I/O hardware 104 may include various voltage sources, current sources, signal generators, amplifiers, filters, digitizers, mixers, multiplexers, voltmeters, digital/analog oscilloscopes, data acquisition cards, digital/analog signal controllers and/or processors, modulators, demodulators, logic blocks, and other equipment.

The controller 102 may direct the signal I/O hardware 104 to provide various signals to the superconducting processor(s) 106, as well as detect signals therefrom via the interface hardware 110. In some implementations, the controller 102 may also control various other equipment of the system 100, such as various pumps, valves, and so forth. In some aspects, the controller 102 may include a programmable processor or combination of processors, such as central processing units (CPUs), graphics processing units (GPUs), and the like. As such, the controller 102 may be configured to execute instructions stored in a non-transitory computer readable-media. In this regard, the controller 102 may be any computer, workstation, laptop or other general purpose or computing device. Additionally, or alternatively, the controller 102 may also include one or more dedicated processing units or modules that may be configured (e.g. hardwired, or pre-programmed) to carry out steps, in accordance with aspects of the present disclosure.

The housing unit 108 is configured to control the environment to which the superconducting processor(s) 106 is exposed. For instance, the housing unit 108 may include various components and hardware configured to control the temperature of the superconducting processor(s) 106, as well as the liquid and/or gas mixture surrounding the superconducting processor(s) 106. In addition, the housing unit 108 may also be configured to control external noise signals, such as stray electromagnetic signals. To this end, the housing unit 108 may include various shielding units and filters. By way of example, the housing unit 108 may include, or be part of, a dilution refrigerator, or other low-temperature system or cryostat, that is capable of operating over a broad range of temperatures, including temperatures less than the critical temperature of the superconductor materials in the superconducting processor(s) 106 (e.g., temperatures less than 4 Kelvin).

The interface hardware 110 provides a coupling between the signal I/O hardware 104 and the superconducting quantum processor(s) 106, and may include a variety of hardware and components, such as various cables, wiring, RF elements, optical fibers, heat exchangers, filters, amplifiers, attenuators, local oscillators, waveform generators, converters, mixers, stages, and so forth.

As shown in FIG. 2D, the superconducting processor(s) 106 may include a qubit architecture 112 connected to control circuitry 114 by way of various control coupling(s) 116. The qubit architecture 112 may include any number of qubits configured in any manner. In some implementations, the qubit architecture 112 may include one or more transmon qubits. However, the qubit architecture 112 may include other qubit types.

The control circuitry 114 may be in communication with the signal I/O hardware 104, and configured to control qubits in the qubit architecture 112 by providing various control signals thereto. In some implementations, the control circuitry 114 includes a microwave driver that is coupled to the qubit architecture 112. For purposes of illustration, a microwave driver, frequency tuning hardware, or biasing hardware may be coupled to a qubit-microwave photon counter pair. The microwave driver may be configured to generate and provide a microwave drive frequency to control qubits or prepare cavity point states in the qubit architecture 112. The frequency tuning hardware may be configured to apply a current, voltage, or the like or biasing hardware may be configured to generate and provide a flux to bias the microwave photon counter or the qubit. This may be accomplished by way of the signal I/O hardware 104, which as directed by the controller 102, may initiate and control the timing, intensity and repetition of microwave drive frequency provided by the microwave driver or a current, voltage, or flux for biasing the components of the qubit-microwave photon counter pair, such as the microwave photon counter or qubit.

Other example control signals directed by the control circuitry 114 to the qubit architecture 112 may also include microwave irradiation signals, current signals, voltage signals, magnetic signals, and so on. To this end, the control circuitry 114 may include various other circuitry, including any number of linear and non-linear circuit elements, such as Josephson junctions, inductors, capacitors, resistive elements, superconducting elements, transmission lines, waveguides, gates, and the like.

The control couplings 116 providing a communication between the qubit architecture 112 and control circuitry 114 may be configured to transmit, modulate, amplify, or filter, the pulse sequence generated using the control circuitry 114. Such control couplings 116 may include various circuitry, including capacitive or inductive elements, passive superconducting microstrip lines, active Josephson transmission lines, including any number of Josephson junctions, and so forth.

Referring again to FIG. 2D, the qubit architecture 112 may also be connected to readout circuitry 118 via readout coupling(s) 122. The readout circuitry 118 may be configured to perform readout on qubits in the qubit architecture 112, and provide corresponding signals to the signal I/O hardware 104. As non-limiting examples, the readout circuitry 118 may include various resonant cavities, logic circuits, as well as any number of linear and non-linear circuit elements, such as Josephson junctions, inductors, capacitors, resistive elements, superconducting elements, transmission lines, waveguides, gates, and the like. In some aspects, the controller 102 may direct the signal I/O hardware 104 to provide signals for modulating or tuning the control couplings 116 and/or readout couplings 122.

In certain desired configurations, the control couplings 116 and/or readout couplings 122 may be designed such that non-equilibrium quasiparticles generated in the control circuitry 114 or readout circuitry 118 are isolated from the qubit architecture 112 in a manner intended to avoid the introduction of degrees of freedom leading to quantum decoherence. For example, quasiparticle poisoning can be mitigated by avoiding direct galvanic connection between the signal and ground traces of the qubit architecture 112 and the control circuitry 114 and/or readout circuitry 118.

Figure 2E:
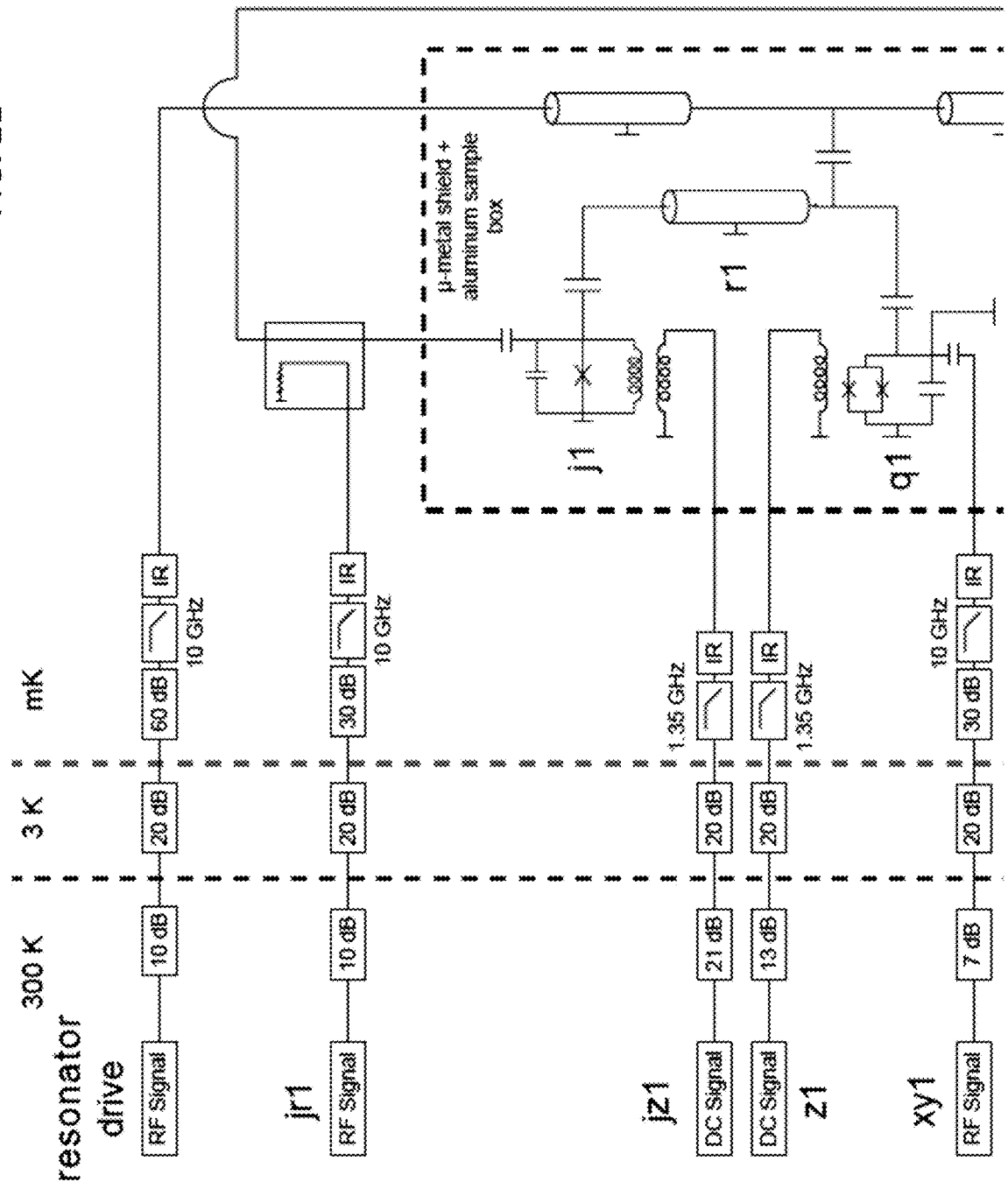
Figure 2E:
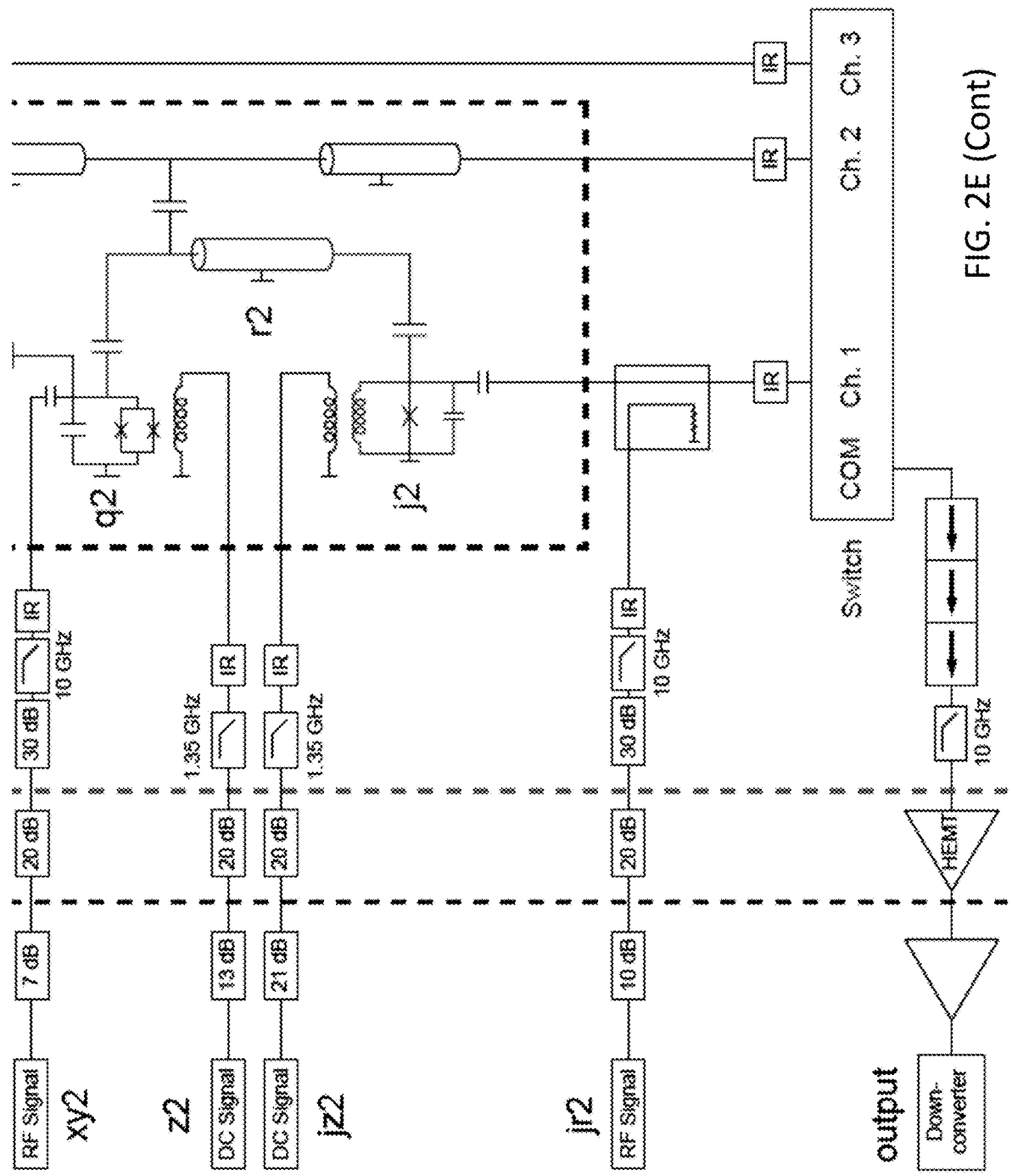

FIGS. 2E-2D provide a wiring diagram for an exemplary system in accordance with the present disclosure utilized for the following Examples.

Figure 3A:
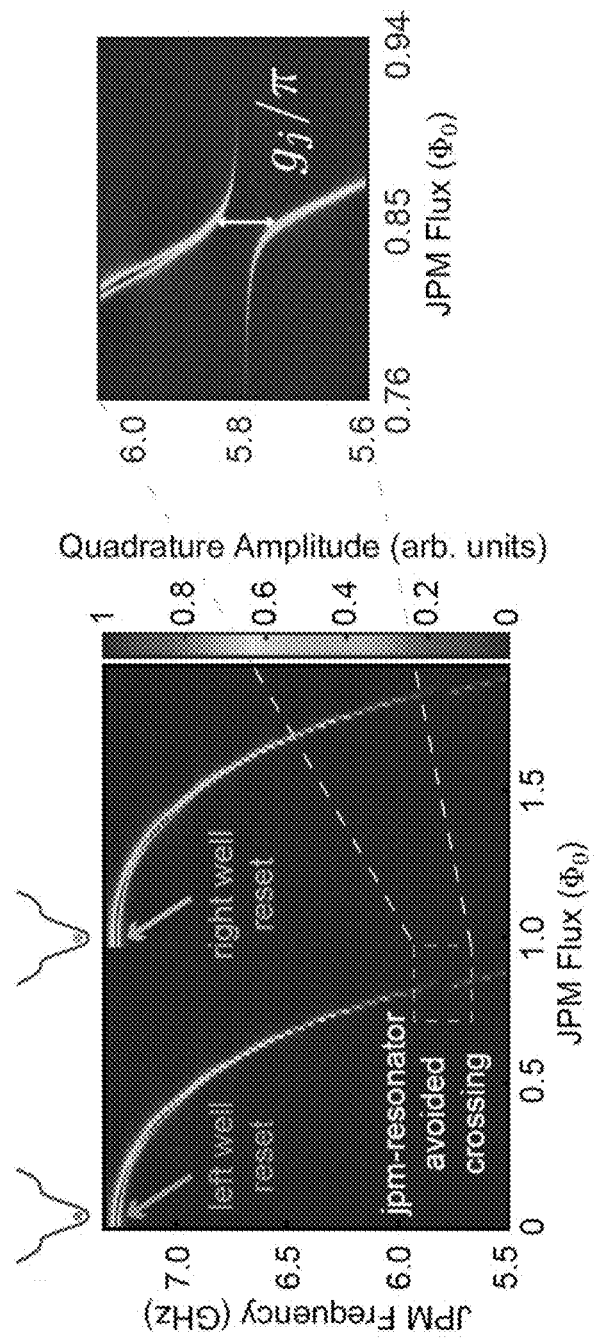
FIG. 3A-3B show microwave photon counter bring-up.

Device bring-up begins with JPM spectroscopy versus external flux, which yields the locations of the reset bias points that initialize the JPM in the left and right wells of its double-well potential along with the JPM-resonator avoided level crossing [FIG. 3A]. Heterodyne detection of this signal yields in-phase (I) and quadrature (Q) components that depend on the applied frequency, the external flux bias of the JPM, and the flux state of the device. Arrows indicate left- and right-well reset bias points, where the potential energy landscape of the JPM supports only a single minimum. Referring to FIG. 3A, the enlargement to the right shows the JPM-resonator avoided level crossing. Following pointer state preparation, the JPM is biased to this point to induce resonant excitation of the JPM by the bright pointer.

Figure 3B:
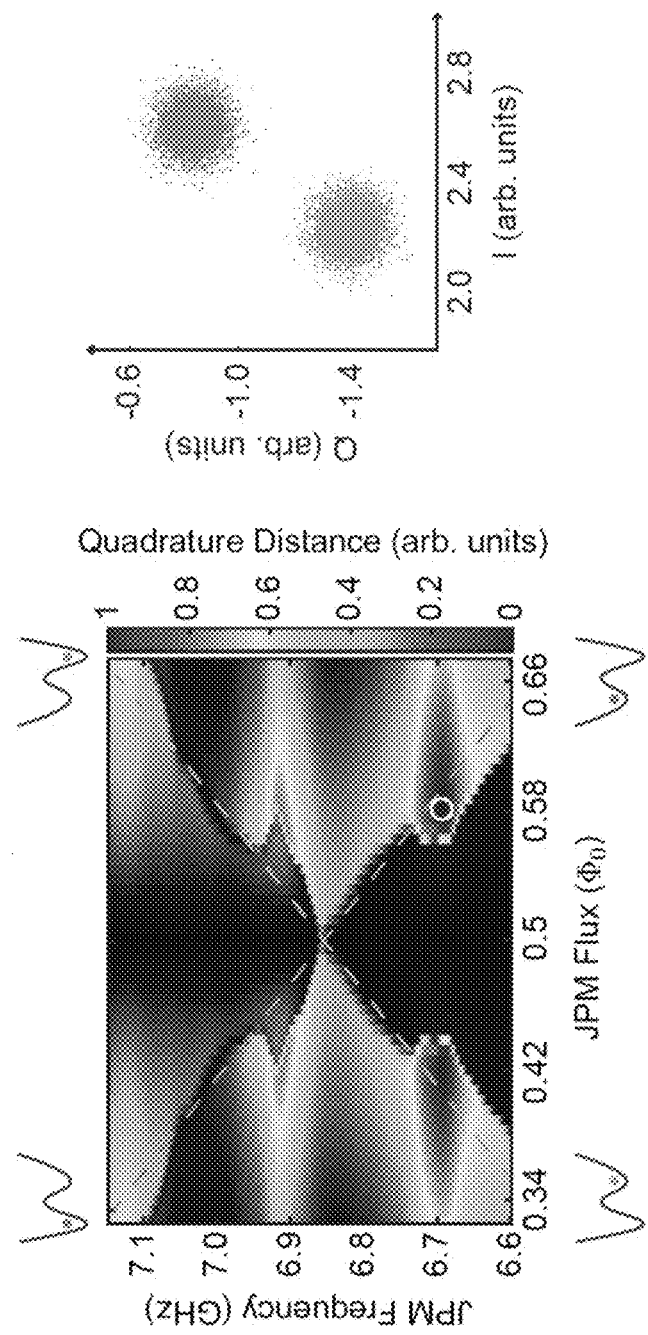

Contrast of JPM reflectometry is maximized for states prepared in the left and right wells over the space of JPM readout flux, measurement frequency, and JPM drive power [FIG. 3B]. The circle indicates the optimal parameters for JPM readout. IQ clouds for JPM readout at this point are shown on the right; here, the separation fidelity is better than 99.99% for a readout time of 250 ns. The JPM is initialized in the left well of its potential and we refer to the probability of a transition to the right well as the tunneling probability.

Measurement Sequences

Figure 4A:
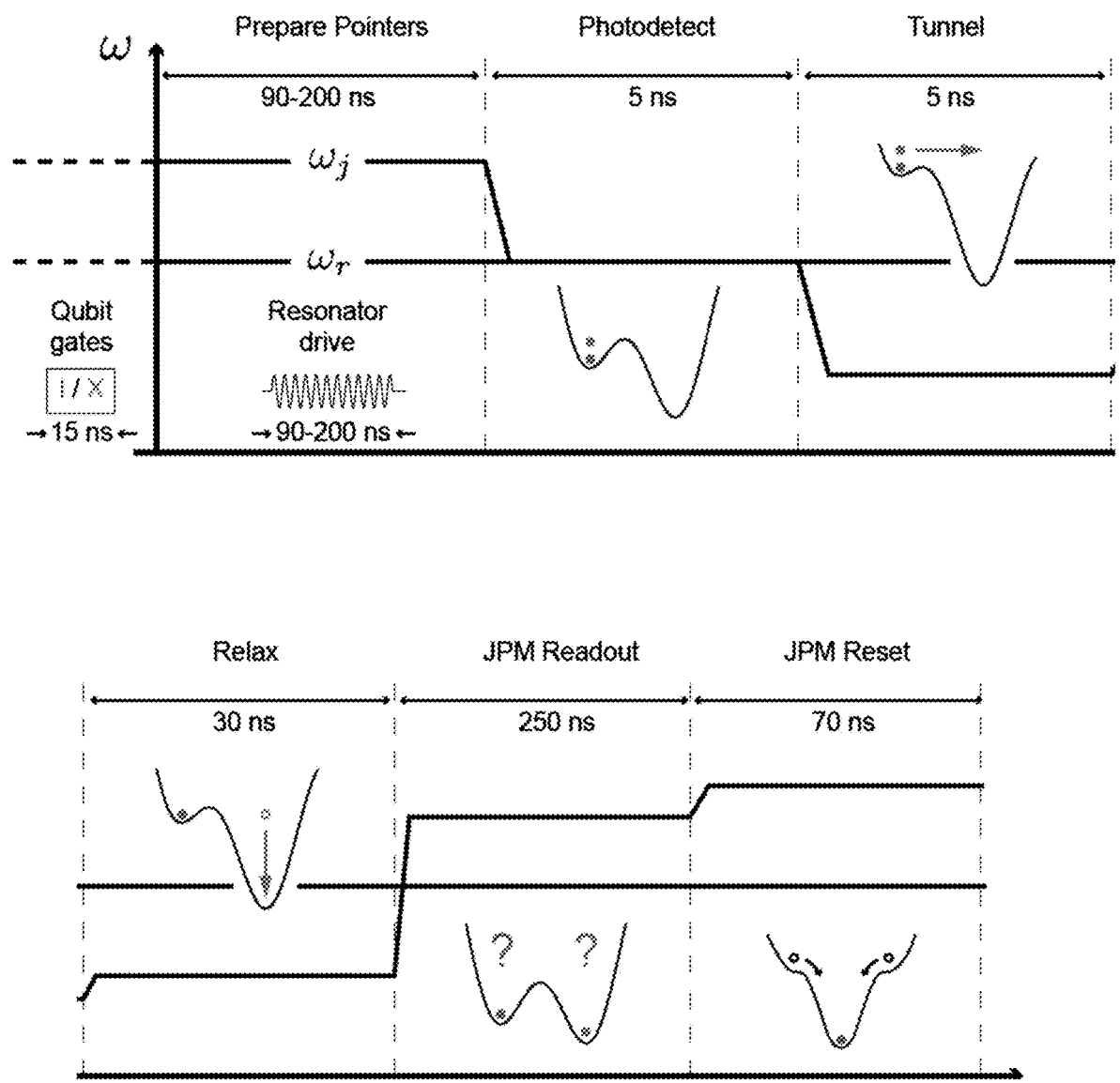
FIGS. 4A-4D show microwave photon counter-based qubit measurement sequence.
Figure 4B:
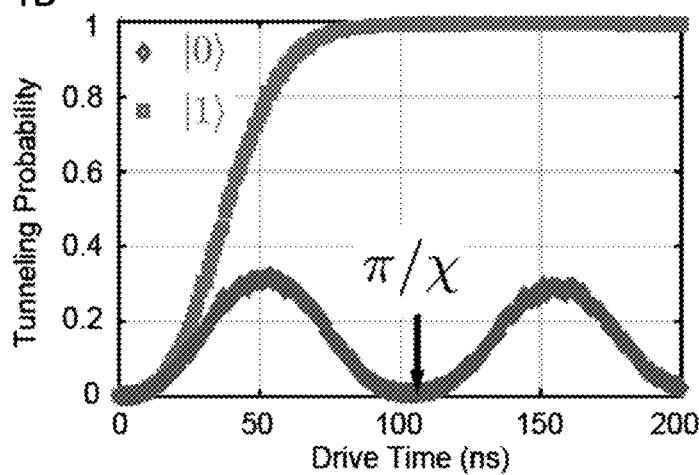
Figure 4C:
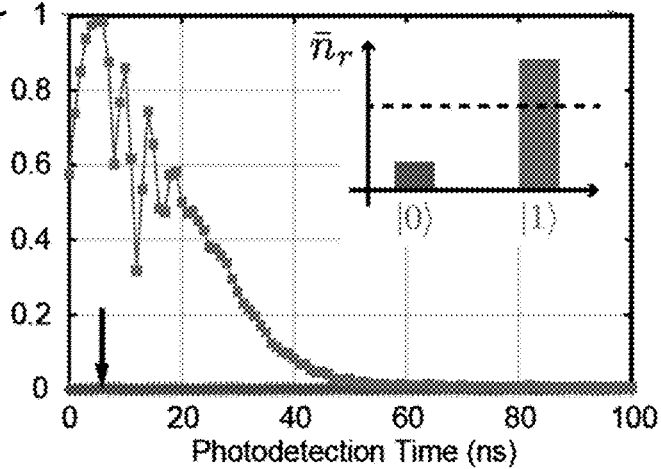
Figure 4D:
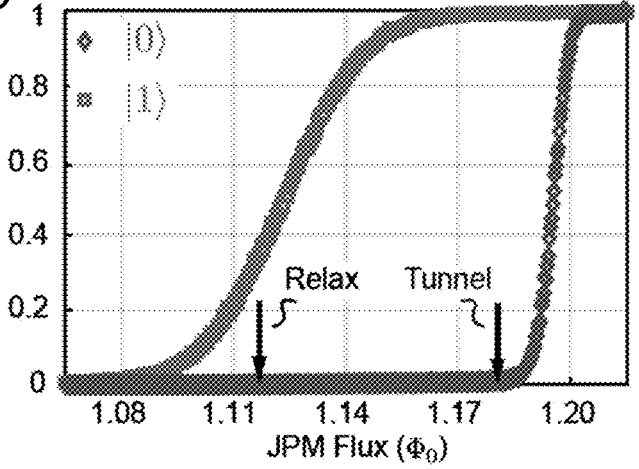

A timing diagram of the qubit measurement sequence is shown in FIG. 4A. FIGS. 4B-4D depict the evolution of the JPM phase particle during critical steps of the measurement sequence. The duration of each step is indicated at the top of each panel. For clarity, the time axis is not drawn to scale. During qubit operations prior to measurement, the microwave photon counter is biased at its flux-insensitive upper sweet spot to minimize microwave photon counter-induced damping of the measurement resonator. The target qubit state may be prepared by applying the X-gate or I-gate. To achieve high-fidelity single-qubit gates, fast (e.g., 15 ns-long) cosine-shaped derivative reduction by adiabatic gate (DRAG) pulses with a static detuning correction may be implemented. At the start of the measurement sequence, microwave drive at frequency $\omega_{r,|1>}$ is used to prepare the bright pointer state. FIG. 4B shows the time evolution of optimized pointer states as detected by a JPM. The resonator drive time $t_d$=105 ns for the datasets is shown in FIGS. 4C-4D. Next, the JPM is biased into resonance with the measurement resonator to induce intrawell excitations of the phase particle conditioned on the qubit state. The energy transferred into the JPM is maximal for a photodetection time of 5 ns≈$\pi/2g_{j,r}$ [FIG. 4C]. This timescale is independent of the photon occupation in the resonator, as one expects for coupled harmonic systems: at the JPM-resonator avoided level crossing, the left well of the JPM supports approximately 50 bound states. Immediately following photodetection, the JPM is biased towards the critical, tunneling flux at which the shallow minimum in the potential energy landscape vanishes in order to induce interwell tunneling of excited states [FIG. 4D]. The duration and amplitude of this bias pulse may be chosen to maximize tunneling contrast between qubit excited and ground states; the optimal tunnel bias point is indicated by the arrow in FIG. 4D labeled "Tunnel." The JPM bias may be adjusted to a relaxation flux, indicated by the arrow in FIG. 4D labeled "Relax", to allow the tunneled phase particle to relax for a relaxation time, e.g., 30 ns. Without this step, a small fraction (e.g., ~5%) of the tunneled population migrates back into the left well, resulting in a degradation of measurement fidelity. The S-curves are well separated, corresponding to a raw measurement fidelity of 98.4%. Following the tunneling event, the flux state of the JPM is read out in reflection using the methods discussed in FIG. 3B. To retrieve the qubit measurement results, we read out the JPM state using the methods illustrated in FIG. 3B. Finally, the JPM is reset into the left-well state for use in subsequent experiments.

Pointer State Preparation

Figure 5A:
FIGS. 5A-5F shows pointer state preparation.
Figure 5B:
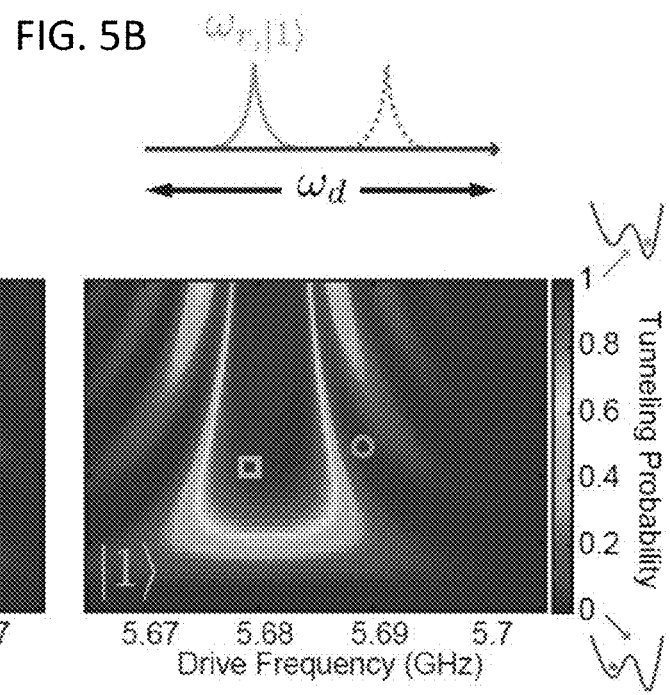
Figure 5C:
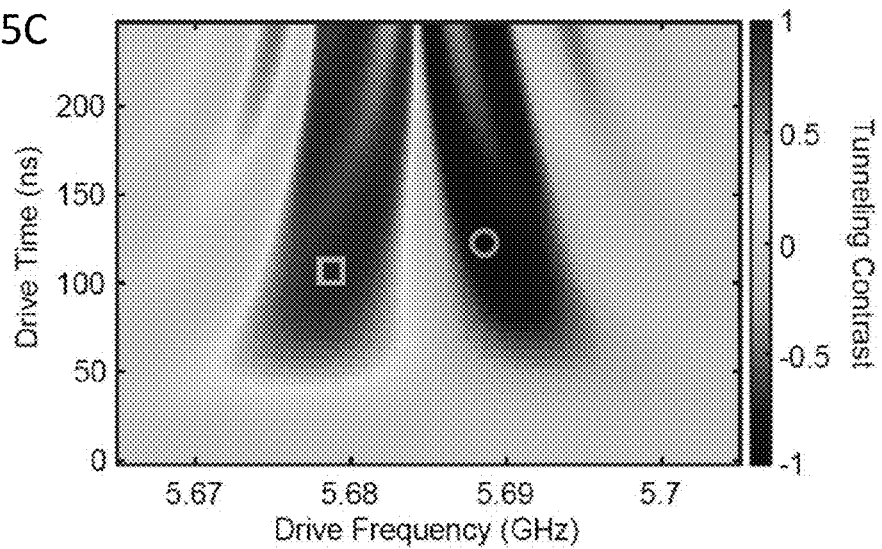

The present measurement protocol relies on the ability to create high-contrast microwave cavity pointer states conditioned on the state of the qubit. To achieve this experimentally, the optimal resonator drive frequency, time, and amplitude are determined. To optimize pointer state preparation, two-dimensional scans of the resonator with sweeps of both drive frequency and time are preformed, as shown in FIGS. 5A-5B. Both datasets are taken over identical ranges and differ only in the prepared qubit state. The illustrations above each plot indicate scanning over a range of frequencies containing both dressed resonances of the cavity, with the dressed resonance corresponding to the prepared qubit state drawn using a solid line. Optimal measurement contrast is achieved at drive parameters that maximize the difference in tunneling probability for the prepared qubit states |0> and |1> [FIG. 5C]. The optimal parameters correspond roughly to cavity drive at frequency $\omega_d=\omega_{r,|1>}$ (overlaid squares) and $\omega_d\approx\omega_{r,|0>}$ (overlaid circles) for a duration $t_d\approx\pi/\chi$. Slight deviation of the optimal drive frequency from the two dressed cavity resonance frequencies and of the optimal drive time from $\pi/\chi$ can be understood as the result of nonlinearity of the measurement resonator inherited from the qubit; this nonlinearity similarly limits the size of the bright pointer state that can be created with a naive cavity ringup pulse applied at fixed frequency. As the dressed cavity resonance corresponding to qubit |1> disperses less strongly with power than the resonance corresponding to qubit |0>, optimal measurement fidelity with cavity drive $\omega_d\approx\omega_{r,|1>}$ is achieved. This means that the qubit |1> and |0> states are mapped onto the bright and dark cavity pointer states, respectively.

Figure 5D:
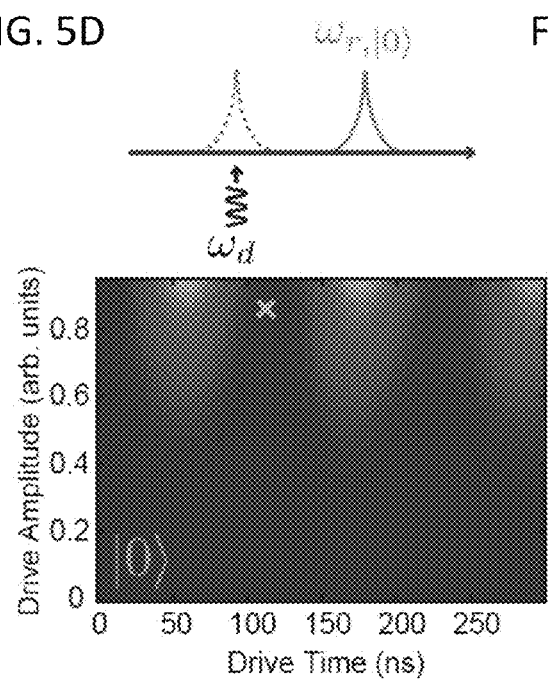
Figure 5E:
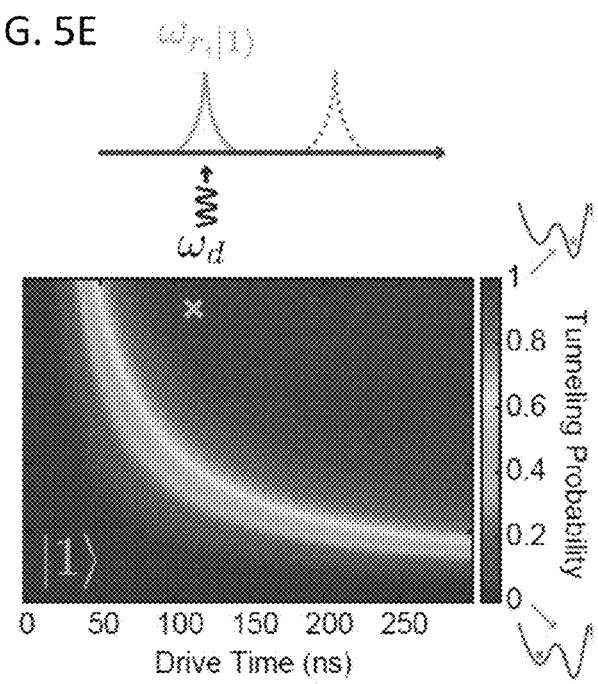
Figure 5F:
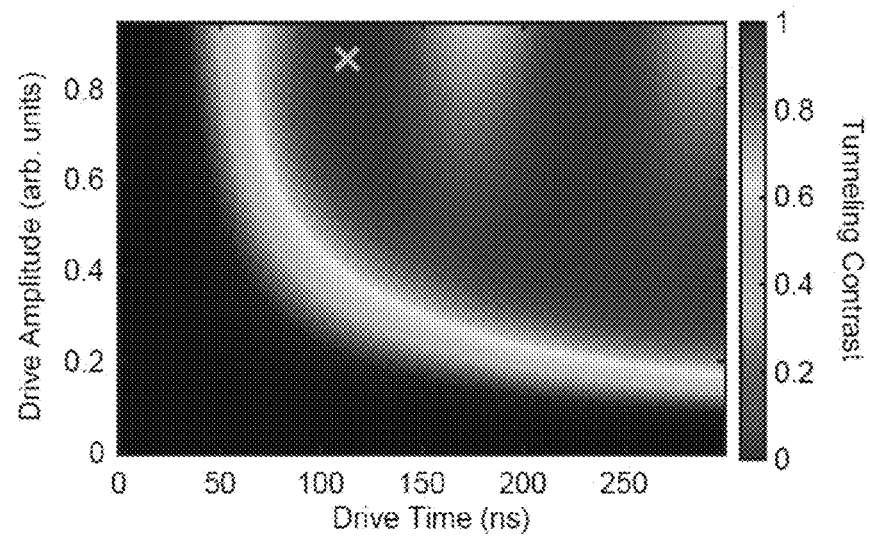

Two-dimensional scans of the resonator with sweeps of both drive amplitude and time may be performed, as shown in FIGS. 5D-5E. The illustrations above each plot indicate the frequency of the cavity drive with respect to the dressed cavity resonances. Taking the difference between these scans yields the optimal drive amplitude and time as shown in FIG. 5F. Scans of type FIGS. 5A-5B and FIGS. 5D-5E may be repeated iteratively to optimize single-shot measurement fidelity over the space of resonator drive time, frequency, and amplitude. The final results of this exemplary embodiment are displayed in FIG. 4B. This method converges on a drive frequency that is −2.1 MHz detuned from $\omega_{r,|1>}/2\pi$, leading to a 22% decrease in the resonator drive time as compared to $\pi/\chi$. The bright pointer state corresponds to a mean resonator occupation $\bar{n}_r\approx 27$ photons, determined via the ac Stark effect. Ultimately, photon number contrast is limited by imperfect preparation of the dark pointer state: as occupation of the dark pointer becomes comparable to the critical photon number $n_{crit}=(\Delta_{q,r}/g_{q,r})^2/4$, the nonlinearity of the resonator prevents coherent oscillation back to the vacuum state, contributing an infidelity around 0.6% as explained further below. Suppressing this source of infidelity may be achieved with an alternative ringup sequence comprising the use of either composite pulses or a chirped frequency drive.

Measurement Fidelity

Figure 6A:
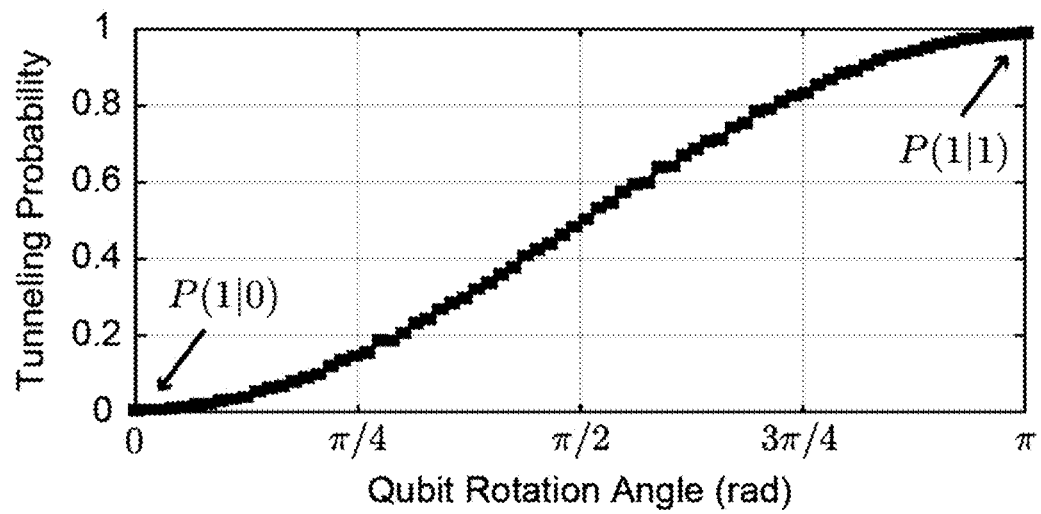
FIGS. 6A-6B shows measurement fidelity and long-term stability.

The performance of JPM-based measurement was analyzed in terms of the fidelity $F=1-P(1|0)-P(0|1)$, where $P(i|j)$ is the probability of measuring the qubit in state |i> given that it was nominally prepared in state |j>. Detection of a tunneling transition from the left well to the right well of the JPM constitutes measurement of the qubit |1> state, while the absence of a tunneling transition constitutes measurement of qubit |0>. Using the measurement sequence described in FIG. 4A, a Rabi experiment may be performed to identify values for P(1|1) and P(1|0) as shown in FIG. 6A. Assuming that leakage errors are negligible, $F=P(1|1)-P(1|0)$. In order to faithfully estimate the conditional probabilities P(i|j), the measurement sequence is repeated 5,000 times. Prior to each measurement, an active qubit reset step is performed to extract unwanted excess |1> population from the qubit; without this step, the excess |1> state population of our qubits is approximately 4%.

Figure 6B:
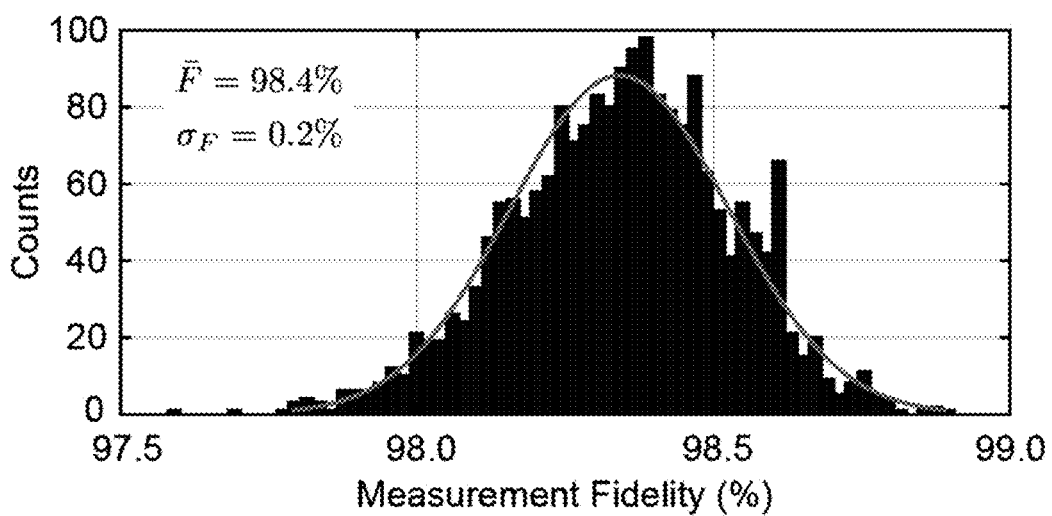

To characterize the long-term stability of JPM-based measurement, 20,000 independent determinations of F evenly spaced over the span of twelve hours were performed. The results are shown in the histogram of FIG. 6B. An average raw measurement fidelity $\bar{F}=98.4\pm0.2\%$, uncorrected for state preparation, relaxation, or gate errors is achieved. A detailed budget of measurement infidelity is shown in Table 2. The nonvanishing P(1|0) contains contributions both from qubit initialization errors and from imperfect dark pointer state preparation. An excess |1> population of 0.3% may be inferred following active qubit reset. This initialization infidelity degrades both P(0|0) and P(1|1), contributing an overall infidelity of 0.6% to our measurement. The remaining portion of P(1|0) is attributed to imperfect dark pointer state preparation, for which we obtain 0.6%. Nonvanishing P(0|1) contains additional contributions from qubit relaxation and X-gate error. Qubit relaxation with timescale $T_1=16.9$ us contributes an infidelity $t_d/2T_1=0.3\%$, where $t_d=105$ ns is the drive time for pointer state preparation. Finally, interleaved randomized benchmarking (IRB) may be performed to characterize the infidelity of the X-gate. For the present Example, the infidelity is 0.1%.

Fidelity was characterized for system q1-j1 on chip #1 over a range of qubit operating points, corresponding to a range of optimal resonator drive times from 90-200 ns. Results are shown in rows 1-4 of Table 3. For all experiments, the same readout parameters are maintained as calibrated at the initial qubit bring up point $\omega_q/2\pi=5.037$ GHz, apart from the resonator drive frequency and the resonator drive time, which must be matched to $\pi/\chi$. Similar performance across all four qubit frequencies is maintained. This demonstrates that fine-tuning of JPM bias parameters is not needed to address qubits that resonate over a broad range of frequencies.

While the above results were obtained for the single qubit-JPM pair q1-j1 on chip #1, similar performance was observed for the three other qubit-JPM pairs examined. Measurement fidelities for these devices are reported in rows 5-7 of Table 3. The durations of the flux bias parameters determined from our bring-up of pair q1-j1 on chip #1 were used for all remaining qubit-JPM pairs, without full optimization of each separate qubit-JPM system. The first entry of Table 3 corresponds to the data shown in FIG. 6B, and therefore represents the average fidelity $\bar{F}$. The remaining entries (rows 2-7) correspond to single measurements of F. The raw single-shot measurement fidelity averaged over the four qubit-JPM pairs is 98%.

TABLE 2

Infidelity budget for the data displayed in FIG. 6B

| Source of Infidelity | Infidelity | Calculation Method |
|---|---|---|
| Excess |1> population | 0.6% | low power drive |
| Imperfect dark pointer | 0.6% | higher power drive |
| Qubit relaxation | 0.3% | $t_d/2T_1$ |
| X-gate | 0.1% | IRB |

TABLE 3

Measurement fidelity within and across devices.

| Chip # | Qubit-JPM Pair | $\omega_q/2\pi$ (GHz) | Resonator Drive Time | Measurement Fidelity |
|---|---|---|---|---|
| 1 | q1-j1 | 5.037 | 105 ns | 98.4% |
| 1 | q1-j1 | 5.098 | 90 ns | 98.3% |
| 1 | q1-j1 | 4.980 | 150 ns | 97.1% |
| 1 | q1-j1 | 4.833 | 200 ns | 98.1% |
| 1 | q2-j2 | 5.069 | 147 ns | 98.0% |
| 2 | q1-j1 | 5.068 | 128 ns | 97.6% |
| 2 | q2-j2 | 5.062 | 163 ns | 98.3% |

Backaction and Crosstalk

JPM tunneling events deposit an energy of order 100 photons on chip as the phase particle relaxes to the global minimum of the potential [see FIG. 7A]. The associated transient contains spectral components at the frequencies of the readout resonator and the qubit, and as a result can transfer energy to these modes [FIG. 7B]. It is therefore important to characterize the backaction and crosstalk associated with JPM tunneling events.

A study of JPM-induced backaction using a Rabi experiment is described in FIG. 7C. Prior to the qubit drive pulse, a deterministic reset of the JPM in the left well is performed and a tunneling event in the JPM is induced. In the absence of mitigation, the Rabi scan yields a nearly constant tunneling probability of 80% as a function of the qubit rotation angle, indicating severe corruption of the qubit and the readout resonator by the JPM tunneling event. Next, JPM-assisted resonator reset prior to the Rabi experiment as a potential mitigation strategy was performed. Namely, the JPM is biased into resonance with the readout cavity for 100-ns as a means to deplete the cavity of photons released by the JPM tunneling event. With resonator reset, we recover Rabi oscillations with low visibility ~30%. In a further refinement, we adjust the bias point of the qubit during the JPM tunneling event from 5.1 GHz down to 4.4 GHz in order to minimize the spectral content of the tunneling transient at the qubit frequency; we refer to this as a "hide bias" step. By concatenating the hide bias step with resonator reset, we obtain a Rabi visibility ~75%. Finally, we append a JPM-assisted qubit reset step to the end of the mitigation sequence. With full mitigation, we recover all but 0.2% of the measurement fidelity compared to the situation with no forced JPM tunneling event.

Figure 8A:
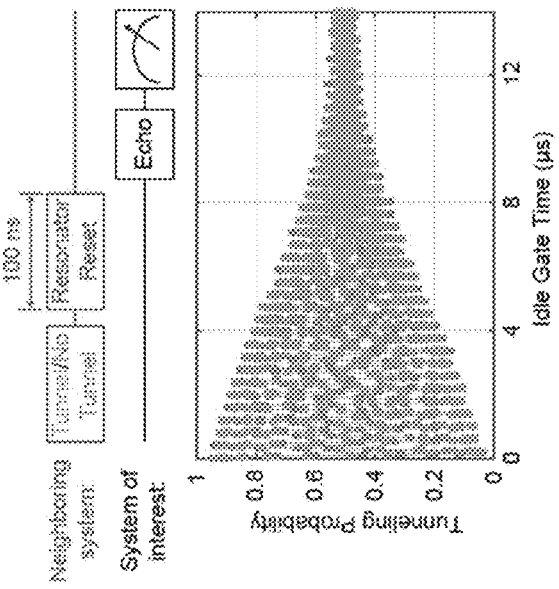
FIGS. 8A-8C show characterization and mitigation of crosstalk induced by the microwave photon counter tunneling event.
Figure 8B:
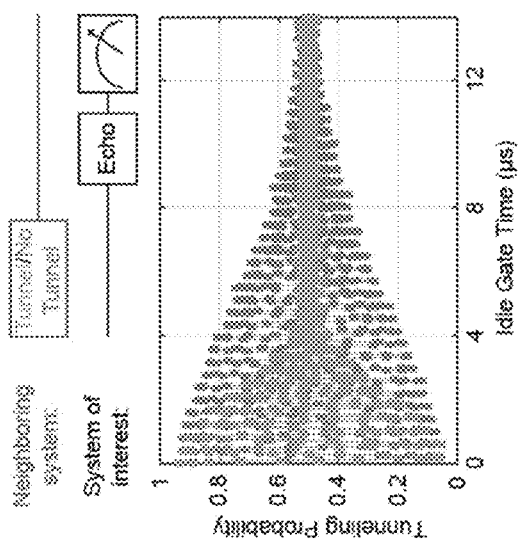
Figure 8C:
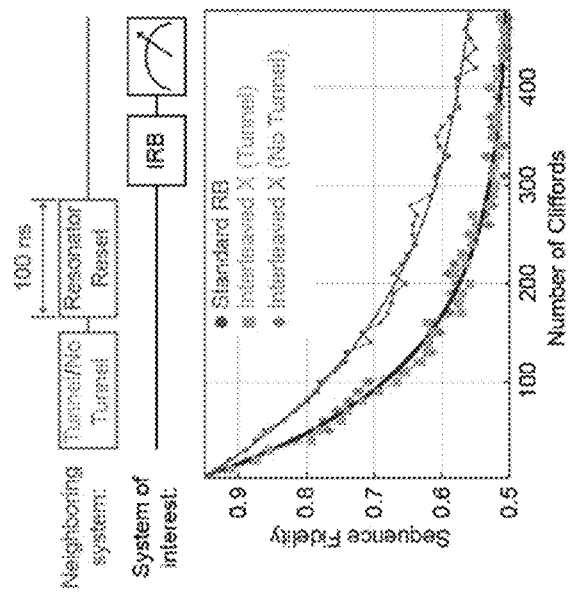

JPM-induced crosstalk to the unmeasured qubit is characterized by performing a spin-echo experiment on one qubit following a forced JPM tunneling event on the neighboring qubit-JPM pair [see FIG. 8A]. Spin-echo is used to probe qubit coherence as opposed to a conventional Ramsey experiment in order to suppress the contribution to dephasing from low-frequency 1/f magnetic flux noise. The spin-echo gate sequence is X/2–Idle/2–Y–Idle/2–X/2. A factor of 2.6 reduction is measured in the Gaussian decay time of the spin-echo fringes with respect to our control experiment. The spin-echo decay envelope obtained from modeling photon shot noise dephasing using our circuit parameters is well described by a Gaussian function of the idle gate time. This indicates the presence of unwanted crosstalk between systems. Without wishing to be bound by theory, it is believed that the enhanced dephasing is due to spurious photon occupation in the measurement resonator of the tunneled JPM, leading to photon shot noise dephasing of the neighboring qubit via parasitic coupling. To test this hypothesis, a resonator reset step is added following the forced tunneling event as shown in FIG. 8B. With resonator reset, identical spin-echo fringes are recovered with respect to the control experiment. To confirm that resonator reset fully mitigates crosstalk of the JPM-based measurement, IRB is used to quantify single-qubit gate error with and without a prior forced JPM tunneling event in the neighboring qubit-JPM system [FIG. 8C]. With resonator reset following the JPM tunneling event, identical interleaved gate fidelities are measured for the tunnel and no tunnel cases, as summarized in Table 4.

TABLE 4

Interleaved randomized benchmarking results for the crosstalk experiments. Each of the interleaved gates reported here has a total duration of 15 ns.

| Interleaved Gate | Gate Fidelity (Tunnel) | Gate Fidelity (No Tunnel) |
| --- | --- | --- |
| X | 99.8 ± 0.3% | 99.8 ± 0.2% |
| X/2 | 99.9 ± 0.3% | 99.9 ± 0.2% |
| I | 99.9 ± 0.1% | 99.9 ± 0.1% |

Figure 9A:
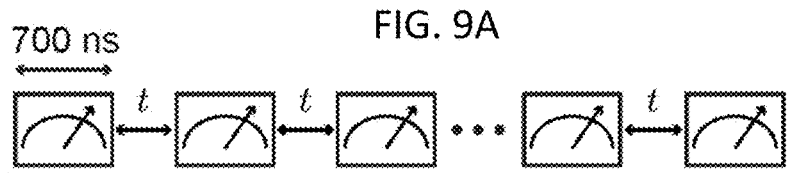
FIGS. 9A-9C show dependence of microwave photon counter-based measurement fidelity on repetition rate.
Figure 9B:
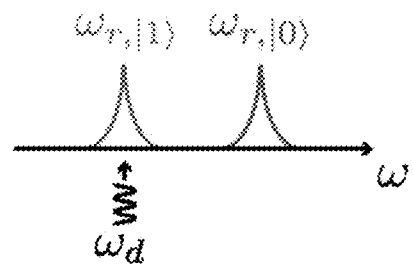
Figure 9C:
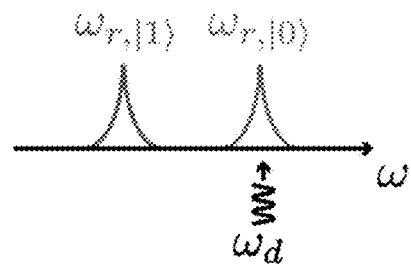

To implement a practical error-corrected superconducting quantum computer based on the two-dimensional surface code, measurement repetition rates of order 1 MHz will be required. For this reason, the dependence of JPM-based measurement fidelity on the time between experiments using the measurement sequence depicted in FIG. 9A is analyzed. It is found that as the time between experiments decreases, the fidelity $P(1|1)$ with which the bright pointer state is detected degrades, with a characteristic time for recovery of fidelity of 13 µs [see FIG. 9B]. Without wishing to be bound by theory, it is believed that the degradation in fidelity is due to enhanced loss in both the qubit and the JPM at high measurement repetition rates. To separately examine the contributions of the JPM and the qubit to the loss of fidelity, the roles of the bright and dark pointer states as shown in FIG. 9C are switched. With the qubit |1> state mapped to the dark cavity pointer, the measurement fidelity is insensitive to enhanced loss in the JPM, since an elevated JPM relaxation rate would preserve the correct outcome for measurement of the dark pointer state (namely, no tunneling event). However, in this case an enhanced $P(0|1)$ for measurement duty cycles below 5 us is seen, indicating a contribution to infidelity either from enhanced qubit relaxation or from qubit initialization errors. Similarly, when the qubit |0> state is mapped to the bright cavity pointer, the tunneling probability $P(0|0)$ is insensitive to qubit loss and dominated by enhanced loss in the JPM element that prevents mapping of the bright pointer state to a tunneling event. The enhanced measurement infidelity observed at high repetition rate is dominated by loss in the JPM, with a small contribution from increased qubit errors at the highest repetition rates >200 kHz. Without wishing to be bound by theory, it is believed that the enhanced loss in both the qubit and the JPM is mediated by the transfer of energy released in the tunneling event to nonequilibrium quasiparticles or to dielectric two-level states (TLS) in the lossy bulk oxides of the JPM or in the surface oxides of the qubit. To preserve measurement fidelity at repetition rates approaching 1-MHz, incorporation of quasiparticle traps into the circuit or a modification of the JPM energy landscape to reduce the energy released by the tunneling event may be employed.

Conclusion

The present technology is a fast, accurate state measurement technique for superconducting qubits using on-chip microwave photon counters. The disclosed techniques provide access to the binary result of projective quantum measurement at the millikelvin stage of a dilution refrigerator; furthermore, it eliminates the need for nonreciprocal circuit components between the qubit and the measurement apparatus. Raw single-shot measurement fidelity >98% was achieved, which compares favorably with the current state of the art.

The physical footprint of a JPM is well matched to the dimensions of the qubit, so that it would be straightforward to integrate a single JPM element with every qubit in a large-scale multiqubit processor; in such an architecture, each cell in the array would require one additional flux bias line for JPM control. Microwave-based readout of the classical flux state of the JPM is amenable to multiplexing for the efficient measurement of large multiqubit arrays with low hardware overhead; alternatively, it is possible to encode the flux state of the JPM in a propagating fluxon that could then be passed to a proximal classical Josephson digital circuit for error monitoring of the qubit array, post-processing of the measurement results, and low-latency feedback. Combined with digital approaches to coherent control this approach to measurement forms the basis for a scalable quantum—classical interface for next-generation superconducting qubit arrays.

Miscellaneous

Unless otherwise specified or indicated by context, the terms "a", "an", and "the" mean "one or more." For example, "a molecule" should be interpreted to mean "one or more molecules."

As used herein, "about", "approximately," "substantially," and "significantly" will be understood by persons of ordinary skill in the art and will vary to some extent on the context in which they are used. If there are uses of the term which are not clear to persons of ordinary skill in the art given the context in which it is used, "about" and "approximately" will mean plus or minus ≤10% of the particular term and "substantially" and "significantly" will mean plus or minus >10% of the particular term.

As used herein, the terms "include" and "including" have the same meaning as the terms "comprise" and "comprising." The terms "comprise" and "comprising" should be interpreted as being "open" transitional terms that permit the inclusion of additional components further to those components recited in the claims. The terms "consist" and "consisting of" should be interpreted as being "closed" transitional terms that do not permit the inclusion additional components other than the components recited in the claims. The term "consisting essentially of" should be interpreted to be partially closed and allowing the inclusion only of additional components that do not fundamentally alter the nature of the claimed subject matter.

All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

All references, including publications, patent applications, and patents, cited herein are hereby incorporated by reference to the same extent as if each reference were individually and specifically indicated to be incorporated by reference and were set forth in its entirety herein.

Preferred aspects of this invention are described herein, including the best mode known to the inventors for carrying out the invention. Variations of those preferred aspects may become apparent to those of ordinary skill in the art upon reading the foregoing description. The inventors expect a person having ordinary skill in the art to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

EXAMPLES

Fabrication

These exemplary circuits disclosed herein were fabricated on a high-resistivity (≥10 kΩ-cm) silicon substrate with 100 crystal orientation. Prior to base layer deposition, the substrate is dipped in dilute (2%) hydrofluoric acid for one minute to remove native oxide from the surface. The substrate was loaded into a dc magnetron sputter tool and deposit a 70 nm-thick film of Nb. The first patterning step defines all Nb features including the control wiring, measurement resonators, qubit capacitors, and spiral inductors. This pattern is then transferred into the Nb using an inductively coupled plasma etcher with $Cl_2/BCl_3$ chemistry.

Next, the sample was patterned for liftoff and deposit the insulator used for crossover wiring and parallel-plate capacitors. The 180 nm-thick film of $SiO_2$ is deposited using an electron beam evaporator at an oxygen partial pressure $P_{O2}=10^{-5}$ Torr. In the final photolithography step, we pattern the sample for counterelectrode liftoff. We then deposit a 200 nm-thick Al counterelectrode using an electron beam evaporator after performing an in situ ion mill clean to ensure good metallic contact to the base wiring layer. Finally, the JPM and qubit junctions are formed using a Dolan-bridge process [G. J. Dolan, Appl. Phys. Lett. 31, 337 (1977)] involving an MMA/PMMA resist stack patterned using a 100 keV electron-beam writer. The Al—$AlO_x$—Al junctions are shadow evaporated in an electron beam evaporator following an in situ ion mill clean. This completes the device. Circuit parameters for the chip are listed in Table 1 with component labels indicated in FIG. 2B.

Measurement Setup

Figure 2F:
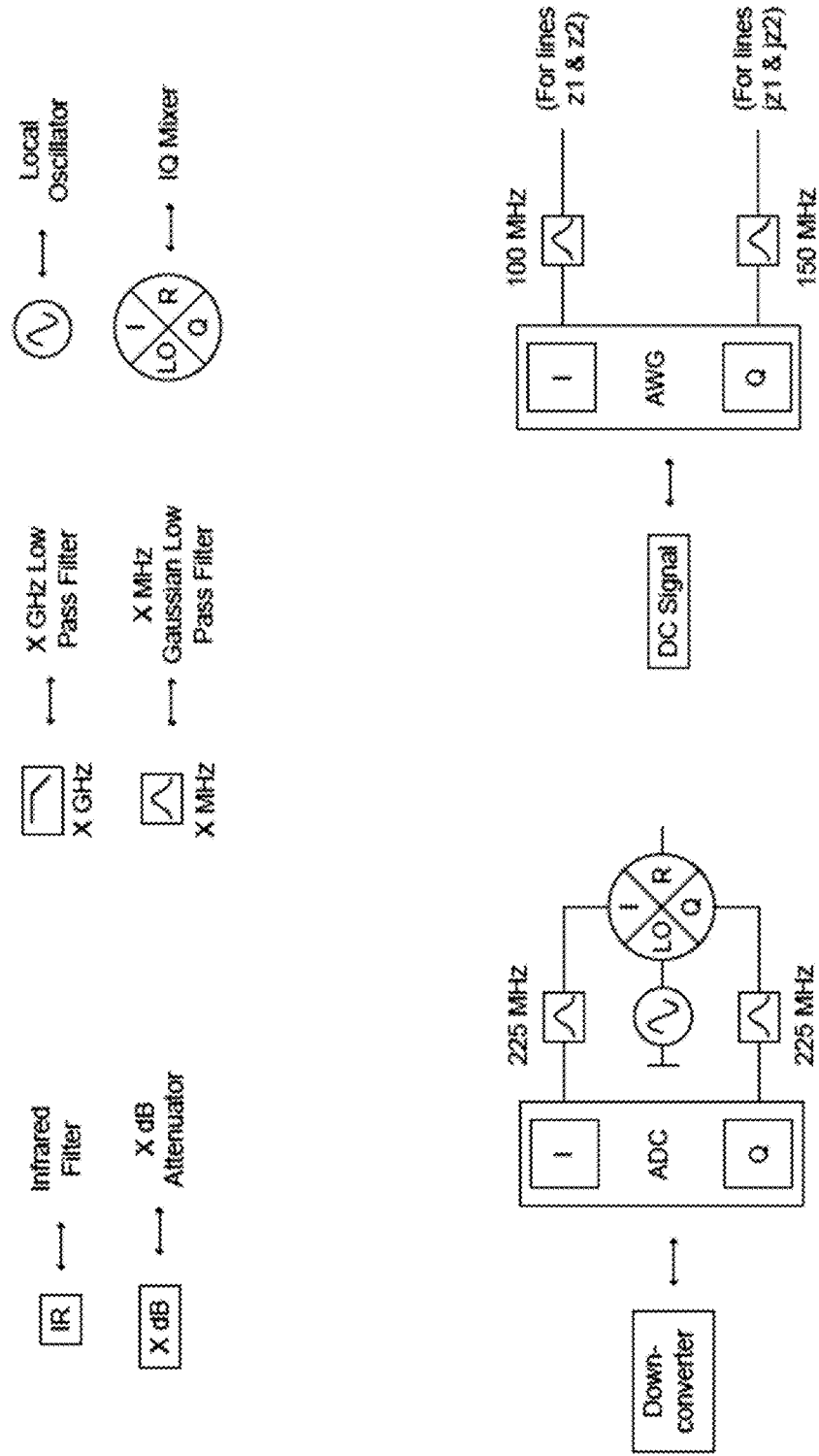
Figure 2F:
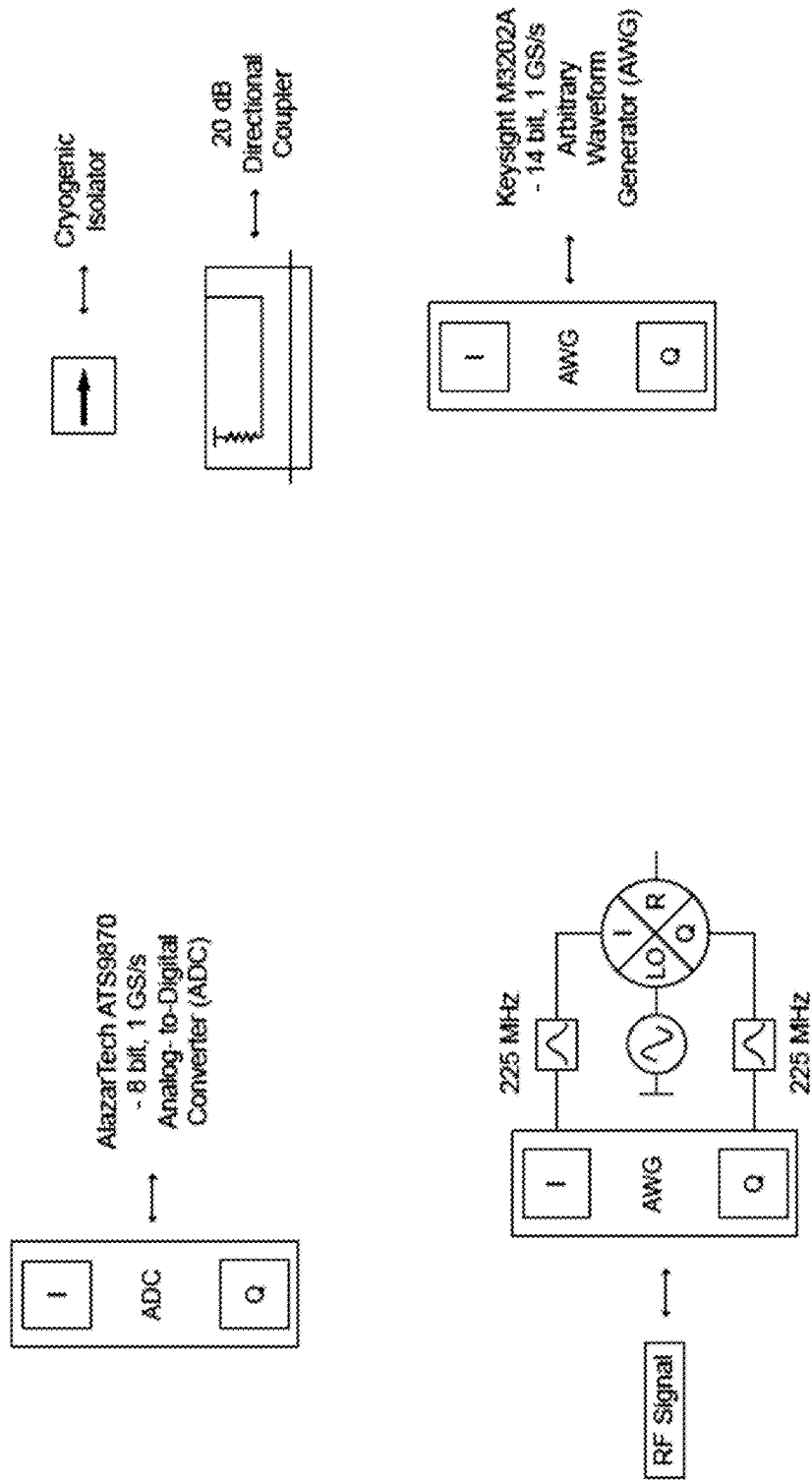

The wiring diagram for our measurement setup is shown in FIGS. 2E-2F. The waveforms for JPM readout (jr1/2), qubit excitation (xy1/2), and resonator drive are generated via single sideband mixing. Keysight M3202A arbitrary waveform generators (AWGs; 14 bit, 1 GS/s) produce intermediate frequency (IF) signals that are mixed with a local oscillator (LO) to generate shaped pulses at microwave frequencies. The qubit and JPM flux-bias waveforms (z1/2 and jz1/2, respectively) are directly synthesized using the AWGs. Signal rise times ≈1-2 ns on the jz1/2 waveforms allow for success of the qubit measurement sequence [see FIG. 4A]. The state of the JPM is read out in reflection using a directional coupler. The reflected signal is passed through several stages of isolation and filtering prior to amplification by a high electron mobility transistor (HEMT) amplifier at the 3~K stage of the cryostat. Following additional room temperature amplification, the signal is sent to the RF port of an IQ mixer where it is down converted and digitized using an AlazarTech ATS9870 analog-to-digital converter (ADC; 8 bit, 1 GS/s). Further signal processing and thresholding are performed in software in order to extract the amplitude and phase of the reflected signal. The fidelity with which we measure the flux state of the JPM is better than 99.99% [see FIG. 3B].

Stark Calibration

Figure 10A:
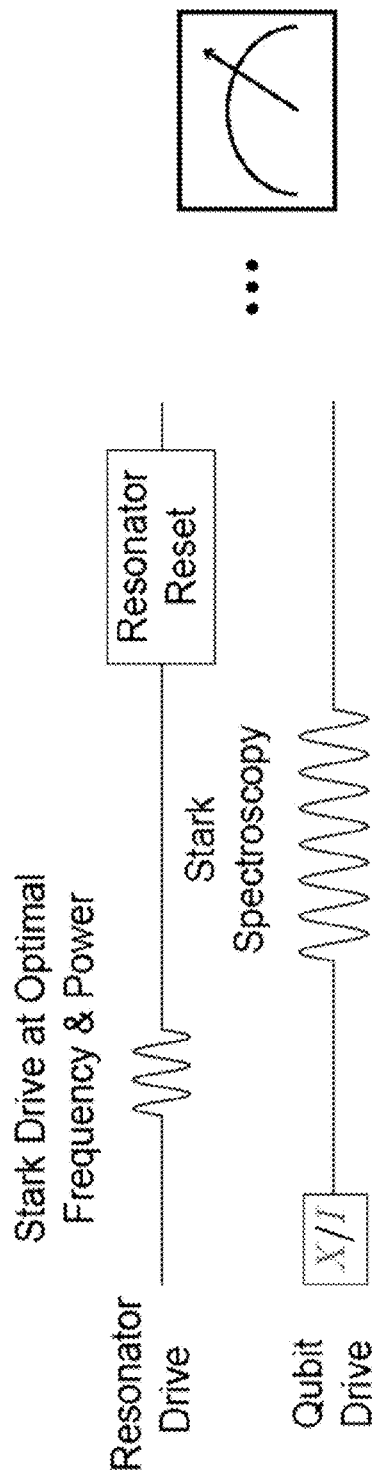
FIGS. 10A-10C show Stark calibration of pointer states.
Figure 10C:
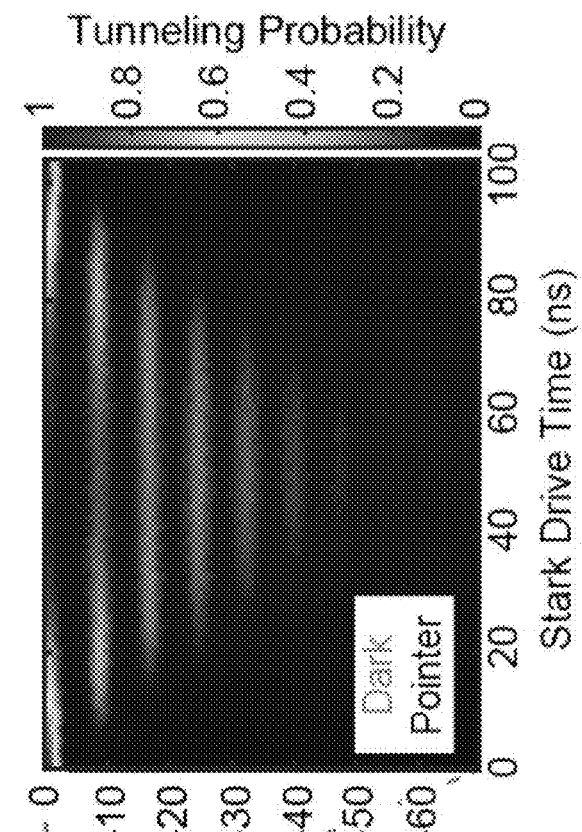
Figure 10B:
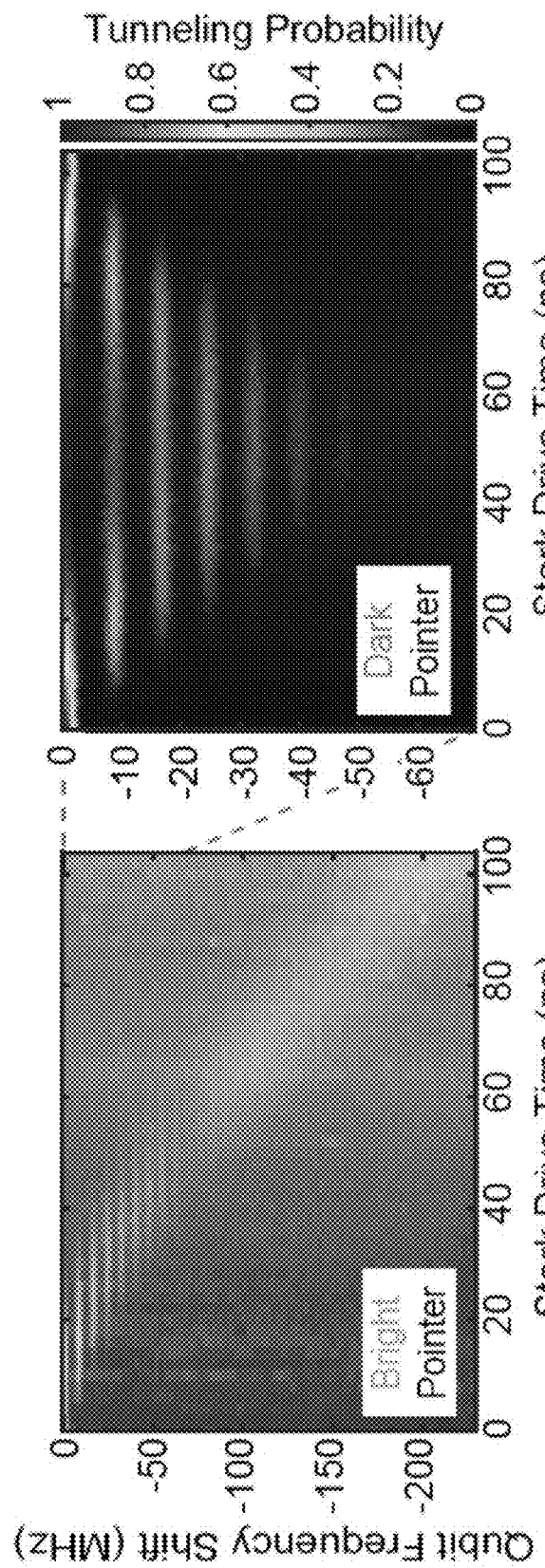

The ac Stark effect was used to estimate photon occupation of the bright and dark pointer states; the pulse sequence is shown in FIG. 10A. First, we prepare the qubit in |1> or |0> through the application of an X-gate or I-gate, respectively. Next, the measurement resonator is driven at the optimal frequency and power found in FIG. 5A-5F but for a variable amount of time, populating the measurement cavity with a mean number of photons $\bar{n}_r$. At the end of the Stark drive, a low-power, 500 ns-long Stark spectroscopy pulse is applied to determine the qubit frequency shift $\Delta\omega_q \equiv \omega_q(\bar{n}_r) - \omega_q(\bar{n}_r = 0)$. Because the photon lifetime in the readout cavity is relatively long ~1.5 µs, $\bar{n}_r$ can be considered static on the timescale of the spectroscopy experiment. We then reset the resonator using the JPM to deplete the remaining photon occupation. Finally, we measure the qubit using the sequence described in FIG. 4A. The results are shown in FIGS. 10B-10C. The bright pointer state corresponds to a mean photon occupation of $\bar{n}_r \approx \Delta\omega_q / 2\chi = 27$ photons, where $\Delta\omega_q/2\pi \approx -200$ MHz at the optimal drive time ($t_d = 105$ ns) and $2\chi/2\pi = 7.4$ MHz is the Stark shift per photon. Similarly, the dark pointer acquires a maximum photon occupation $\bar{n}_r \approx 4$ photons halfway through the drive pulse, but at the end of the resonator drive it returns to a state that is very close to vacuum. For this qubit operation point, the critical photon number $n_{crit} = (\Delta_{q,r}/g_{q,r})^2/4 \approx 13$ photons. It is noted that these estimates of photon occupation neglect the effect of photon loss during the Stark spectroscopy pulse and the dependence of $\chi$ on $\bar{n}_r$.

Fidelity Budget

Figure 11B:
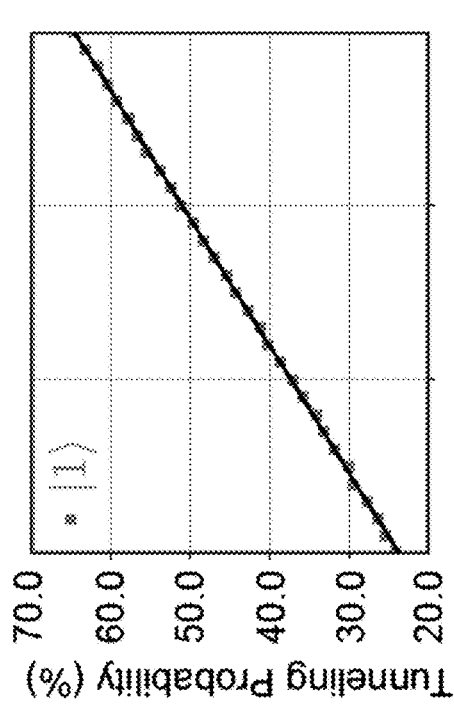
FIGS. 11A-11C estimate excess |1> population.
Figure 11C:
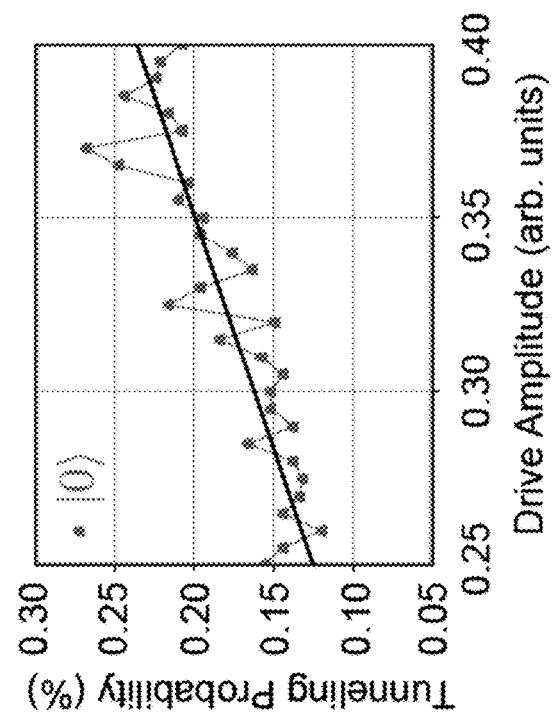
Figure 11A:
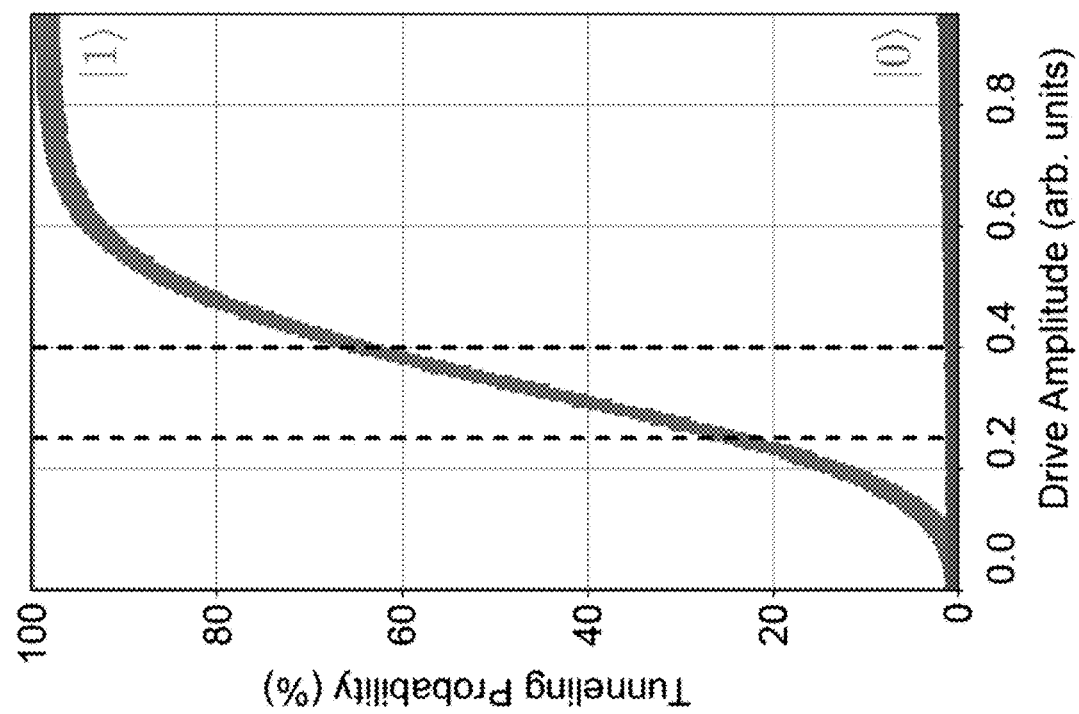

The nonvanishing P(1|0) contains contributions both from qubit initialization errors and from imperfect dark pointer state preparation. In order to separately quantify these errors, we performed a series of measurements following active reset of the qubit with resonator drive amplitude swept from its optimal value down to zero [FIG. 11A]; for comparison with FIG. 10A-10C, the calibration described in that figure was performed at a drive amplitude of 0.885 arb. units. As a result, we can be sure that for drive amplitude ≲0.4 arb. units, the maximum photon occupation of the dark pointer is less than one photon, which is much less than $n_{crit}$ over the entire course of driven evolution; at this level of cavity occupation, the dressed resonance corresponding to the qubit |0> state is well approximated by a linear mode. Therefore, all of the tunneling is attributed at low resonator drive amplitude to excess |1> population alone, eliminating contributions caused by the Kerr nonlinearity of the resonator that occur at full drive strength. In FIG. 11B-11C, we show linear fits to the data of FIG. 11A for resonator drive amplitudes ranging between 0.25-0.4 arb. units. The ratio of the slopes extracted from these fits gives an estimate of excess |1> population of 0.3% for nominal preparation of the |0> state. We attribute the remaining contribution to P(1|0) to imperfect dark pointer preparation, with infidelity 0.6%.

Microwave Photon Counter-Assisted Resonator and Qubit Reset

Figure 12A:
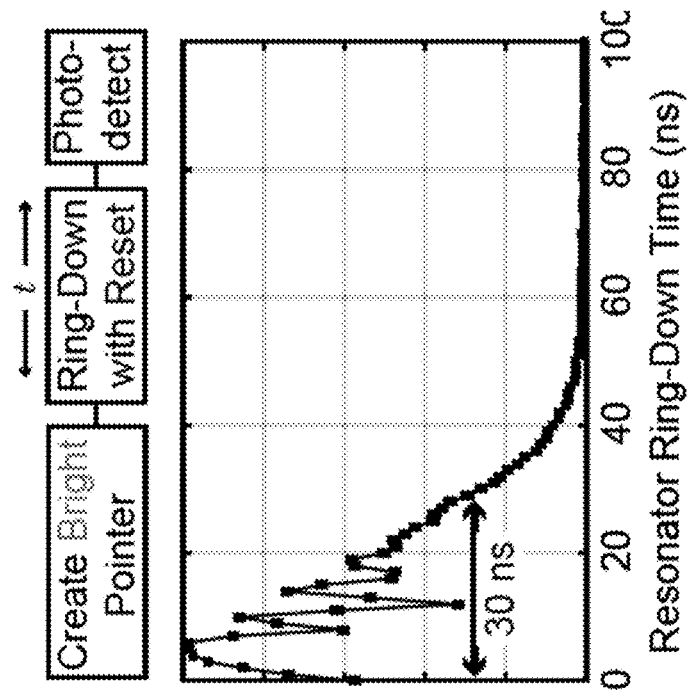
FIGS. 12A-12D show microwave photon counter-assisted resonator and qubit reset.
Figure 12B:
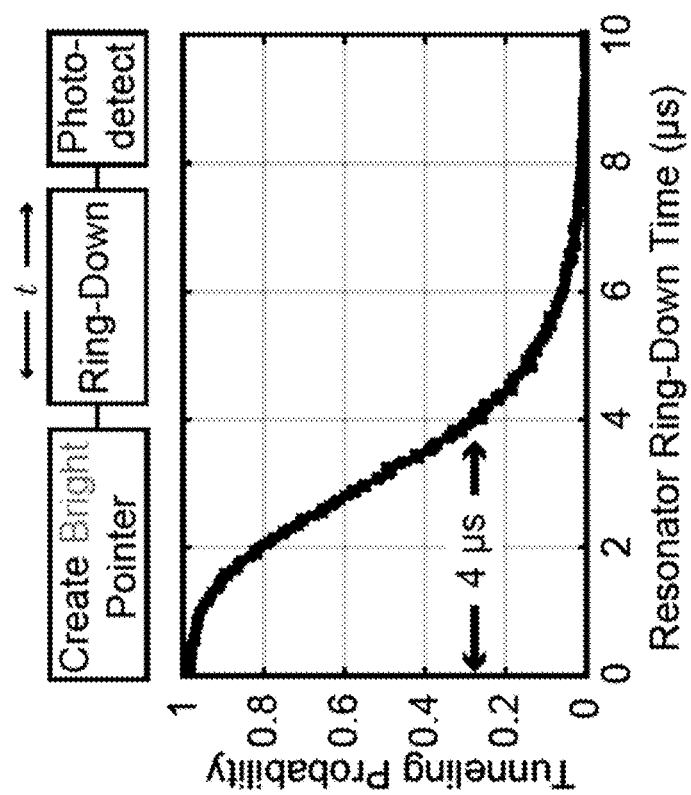

The intrinsic damping of the JPM provides an efficient method for the rapid reset of the resonator and qubit modes. This is accomplished by simply biasing the JPM into resonance with the mode of interest for a brief period of time. The data shown in FIG. 12A-12B demonstrate reset of the measurement resonator. In FIG. 12A JPM tunneling probability is plotted following photodetection of the bright pointer state after a variable ring-down delay. It is observed that passive resonator reset requires ≃10 µs to complete, a consequence of the high-Q measurement resonator used in our design. To accelerate resonator reset, the JPM is biased into resonance with the measurement resonator during the ring-down delay, as shown in FIG. 12B. With the JPM and resonator fully hybridized, the energy decay time of the mode is suppressed to around 10 ns, allowing for rapid on-demand depletion of the measurement resonator. We find that JPM-assisted resonator reset is accomplished in under 100 ns.

Figure 12D:
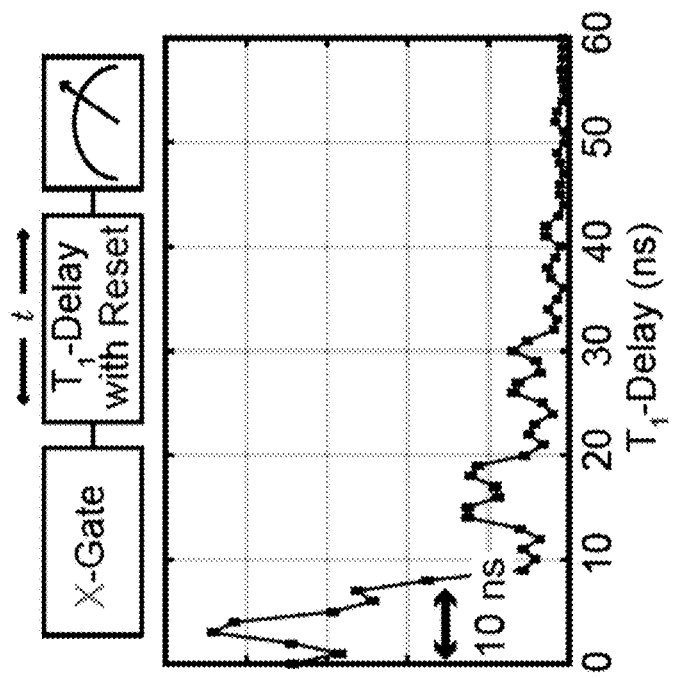
Figure 12C:
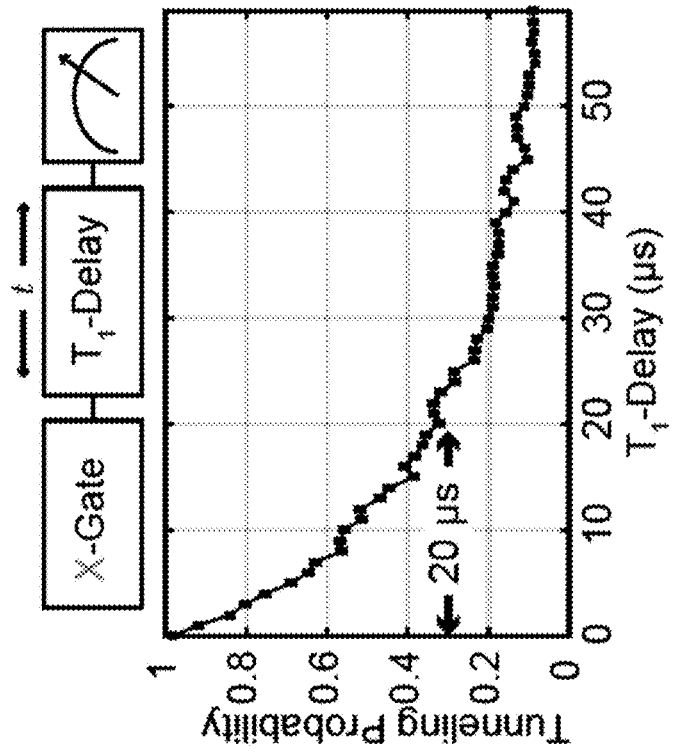

This idea is extended to qubit reset in the experiments described in FIG. 12C-12D. In each of these datasets, qubit |1> occupation is measured after the application of an X-gate followed by a variable delay. Passive reset based on qubit $T_1$ relaxation requires approximately 20 µs. However, when the JPM is biased into resonance with the qubit during reset, accurate qubit initialization is accomplished in under 100 ns. Throughout the experiments described in this manuscript, JPM-assisted qubit reset was used to suppress excess |1> state population from a baseline value of 4% to 0.3%

The invention claimed is:

1. A system for quantum information processing, the system comprising a multiplicity of qubit-microwave photon counter pairs coupled by a qubit-qubit coupling, each of the qubit-microwave photon counter pairs comprising:
   a qubit circuit,
   a microwave photon counter circuit, and
   a resonant cavity coupling the qubit circuit and the microwave photon counter circuit,
   wherein the coupling of the qubit circuit and resonant cavity is configured to yield distinct frequencies corresponding to a bright cavity pointer state and a dark cavity pointer state characterized by differential photon occupation,
   wherein the system is configured to displace a photon field inside the resonant cavity in a qubit state-dependent manner when a microwave drive frequency is applied, and
   wherein the microwave photon counter circuit is a threshold detector of microwave photon occupation of the resonator cavity.

2. The system of claim 1 further comprising a controller configured to frequency tune the microwave photon counter circuit into or out of resonance with the qubit circuit or the resonant cavity.

3. The system of claim 2, wherein the controller is configured to frequency tune the microwave photon counter circuit and qubit circuit into simultaneous resonance with the resonant cavity.

4. The system of claim 1, wherein the microwave photon counter circuit is configured to yield a double-well potential energy landscape.

5. The system of claim 1 further comprising a controller configured to provide the microwave drive frequency to prepare cavity pointer states.

6. The system of claim 1, wherein the multiplicity of qubits of each qubit-microwave photon counter pair are coupled on a single chip.

7. The system of claim 1, wherein the microwave photon counter circuit is a Josephson photomultiplier (JPM) circuit.

8. The system of claim 1, wherein the qubit circuit is a frequency-tunable transmon qubit circuit.

9. The system of claim 1, wherein the resonant cavity is a half-wave coplanar waveguide (CPW).

* * * * *

UNITED STATES PATENT AND TRADEMARK OFFICE
CERTIFICATE OF CORRECTION

PATENT NO. : 12,159,193 B2
APPLICATION NO. : 16/952598
DATED : December 3, 2024
INVENTOR(S) : Robert Francis McDermott et al.

It is certified that error appears in the above-identified patent and that said Letters Patent is hereby corrected as shown below:

In the Specification

Column 2, Line 61, "fec" should be --fee--.

Column 5, Line 2, "amplitudes 0.4" should be --amplitudes $\lesssim 0.4$--.

Column 8, Line 4, "Kr" should be --$\kappa_r$--.

Column 9, Table 1, Line 30, "4. nA" should be --43 nA--.

Column 9, Table 1, Line 31, "transurion" should be --transmon--.

Column 14, Table 2, Line 49, "higher" should be --high--.

Column 16, Line 34, "us" should be --µs--.

Column 18, Line 19, "de" should be --dc--.

Signed and Sealed this
Eleventh Day of February, 2025

Coke Morgan Stewart
*Acting Director of the United States Patent and Trademark Office*